(12) United States Patent
Yoon et al.

(10) Patent No.: US 7,416,979 B2
(45) Date of Patent: Aug. 26, 2008

(54) DEPOSITION METHODS FOR BARRIER AND TUNGSTEN MATERIALS

(75) Inventors: Ki Hwan Yoon, Sunnyvale, CA (US); Yonghwa Chris Cha, San Jose, CA (US); Sang Ho Yu, Sunnyvale, CA (US); Hafiz Farooq Ahmad, Newark, CA (US); Ho Sun Wee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 11/456,073

(22) Filed: Jul. 6, 2006

(65) Prior Publication Data

US 2006/0276020 A1 Dec. 7, 2006

Related U.S. Application Data

(63) Continuation of application No. 10/845,970, filed on May 14, 2004, now abandoned, which is a continuation of application No. 10/044,412, filed on Jan. 9, 2002, now Pat. No. 6,740,585, which is a continuation-in-part of application No. 09/916,234, filed on Jul. 25, 2001, now abandoned.

(51) Int. Cl.
*H01L 21/00* (2006.01)
(52) U.S. Cl. .......... 438/680; 438/682; 438/685
(58) Field of Classification Search .......... 438/680, 438/682, 683, 684, 685; 257/E21.165, E21.169
See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |

(Continued)

FOREIGN PATENT DOCUMENTS

EP 0 497 267 1/1992

(Continued)

OTHER PUBLICATIONS

PCT International Search Report and Written Opinion dated Oct. 23, 2007 for International Application No. PCT/US 07/66442.

(Continued)

*Primary Examiner*—Fernando L Toledo
(74) *Attorney, Agent, or Firm*—Patterson & Sheridan, LLP

(57) ABSTRACT

Embodiments are provided for a method to deposit barrier and tungsten materials on a substrate. In one embodiment, a method provides forming a barrier layer on a substrate and exposing the substrate to a silane gas to form a thin silicon-containing layer on the barrier layer during a soak process. The method further provides depositing a tungsten nucleation layer over the barrier layer and the thin silicon-containing layer during an atomic layer deposition process and depositing a tungsten bulk layer on the tungsten nucleation layer during a chemical vapor deposition process. In some examples, the barrier layer contains metallic cobalt and cobalt silicide, or metallic nickel and nickel silicide. In other examples, the barrier layer contains metallic titanium and titanium nitride, or metallic tantalum and tantalum nitride.

38 Claims, 8 Drawing Sheets

U.S. PATENT DOCUMENTS

| | | |
|---|---|---|
| 4,415,275 A | 11/1983 | Dietrich |
| 4,486,487 A | 12/1984 | Skarp |
| 4,500,409 A | 2/1985 | Boys et al. |
| 4,761,269 A | 8/1988 | Conger et al. |
| 4,824,544 A | 4/1989 | Mikalesen et al. |
| 4,834,831 A | 5/1989 | Nishizawa et al. |
| 4,951,601 A | 8/1990 | Maydan et al. |
| 4,975,252 A | 12/1990 | Nishizawa et al. |
| 4,993,357 A | 2/1991 | Scholz |
| 5,027,746 A | 7/1991 | Frijlink |
| 5,096,364 A | 3/1992 | Messer et al. |
| 5,122,923 A | 6/1992 | Matsubara et al. |
| 5,173,327 A | 12/1992 | Sandhu et al. |
| 5,178,681 A | 1/1993 | Moore et al. |
| 5,186,718 A | 2/1993 | Tepman et al. |
| 5,225,366 A | 7/1993 | Yoder |
| 5,242,566 A | 9/1993 | Parker |
| 5,252,807 A | 10/1993 | Chizinsky |
| 5,261,959 A | 11/1993 | Gasworth |
| 5,281,274 A | 1/1994 | Yoder |
| 5,286,296 A | 2/1994 | Sato et al. |
| 5,294,286 A | 3/1994 | Nishizawa et al. |
| 5,306,666 A | 4/1994 | Izumi |
| 5,320,728 A | 6/1994 | Tepman |
| 5,330,628 A | 7/1994 | Demaray et al. |
| 5,335,138 A | 8/1994 | Sandhu et al. |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,519,373 A | 5/1996 | Miyata |
| 5,526,244 A | 6/1996 | Bishop |
| 5,527,438 A | 6/1996 | Tepman |
| 5,544,771 A | 8/1996 | Lee et al. |
| 5,589,039 A | 12/1996 | Hsu |
| 5,593,551 A | 1/1997 | Lai |
| 5,597,462 A | 1/1997 | Cho |
| 5,616,218 A | 4/1997 | Alex |
| 5,632,873 A | 5/1997 | Steven et al. |
| 5,650,052 A | 7/1997 | Edelstein et al. |
| 5,660,744 A | 8/1997 | Sekine et al. |
| 5,666,247 A | 9/1997 | Schultz |
| 5,674,786 A | 10/1997 | Turner et al. |
| 5,711,811 A | 1/1998 | Suntola et al. |
| 5,728,276 A | 3/1998 | Katsuki et al. |
| 5,730,802 A | 3/1998 | Ishizumi et al. |
| 5,736,021 A | 4/1998 | Ding et al. |
| 5,744,016 A | 4/1998 | Yamada et al. |
| 5,780,361 A | 7/1998 | Inoue |
| 5,785,763 A | 7/1998 | Onda et al. |
| 5,796,116 A | 8/1998 | Nakata et al. |
| 5,804,488 A | 9/1998 | Shih et al. |
| 5,807,792 A | 9/1998 | Ilg et al. |
| 5,814,852 A | 9/1998 | Sandhu et al. |
| 5,834,372 A | 11/1998 | Lee |
| 5,835,677 A | 11/1998 | Li et al. |
| 5,838,035 A | 11/1998 | Ramesh |
| 5,851,896 A | 12/1998 | Summerfelt |
| 5,855,680 A | 1/1999 | Soininen et al. |
| 5,879,459 A | 3/1999 | Gadgil et al. |
| 5,879,523 A | 3/1999 | Wang et al. |
| 5,886,864 A | 3/1999 | Dvorsky |
| 5,902,129 A | 5/1999 | Yoshikawa et al. |
| 5,916,365 A | 6/1999 | Sherman |
| 5,923,056 A | 7/1999 | Lee et al. |
| 5,936,831 A | 8/1999 | Kola et al. |
| 5,945,008 A | 8/1999 | Kisakibaru et al. |
| 5,954,929 A | 9/1999 | Uchiyama et al. |
| 5,972,430 A | 10/1999 | DiMeo, Jr. et al. |
| 6,007,403 A | 12/1999 | Urspringer et al. |
| 6,014,943 A | 1/2000 | Arami et al. |
| 6,015,590 A | 1/2000 | Suntola et al. |
| 6,015,917 A | 1/2000 | Bhandari et al. |
| 6,033,537 A * | 3/2000 | Suguro .................. 204/192.2 |
| 6,042,652 A | 3/2000 | Hyun et al. |
| 6,071,055 A | 6/2000 | Tepman |
| 6,071,572 A | 6/2000 | Mosely et al. |
| 6,084,302 A | 7/2000 | Sandhu |
| 6,099,904 A | 8/2000 | Mak et al. |
| 6,124,158 A | 9/2000 | Dautartas et al. |
| 6,132,575 A | 10/2000 | Pandumsoporn et al. |
| 6,139,700 A | 10/2000 | Kang et al. |
| 6,144,060 A | 11/2000 | Park et al. |
| 6,156,170 A | 12/2000 | Akari et al. |
| 6,156,382 A | 12/2000 | Rajagopalan et al. |
| 6,165,807 A | 12/2000 | Lee et al. |
| 6,171,922 B1 | 1/2001 | Maghsoudnia |
| 6,174,377 B1 | 1/2001 | Doering et al. |
| 6,174,809 B1 | 1/2001 | Kang et al. |
| 6,179,983 B1 | 1/2001 | Reid et al. |
| 6,183,563 B1 | 2/2001 | Choi et al. |
| 6,190,495 B1 | 2/2001 | Kubota et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,218,298 B1 | 4/2001 | Hoinkis |
| 6,218,716 B1 | 4/2001 | Wang et al. |
| 6,221,766 B1 | 4/2001 | Wasserman |
| 6,224,312 B1 | 5/2001 | Sundar |
| 6,225,176 B1 | 5/2001 | Yu |
| 6,231,672 B1 | 5/2001 | Choi et al. |
| 6,235,634 B1 | 5/2001 | White et al. |
| 6,238,533 B1 | 5/2001 | Satitpunwaycha et al. |
| 6,251,759 B1 | 6/2001 | Guo et al. |
| 6,270,572 B1 | 8/2001 | Kim et al. |
| 6,274,484 B1 | 8/2001 | Tsai et al. |
| 6,284,646 B1 | 9/2001 | Leem |
| 6,287,965 B1 | 9/2001 | Kang et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,326,297 B1 | 12/2001 | Vijayendran |
| 6,333,260 B1 | 12/2001 | Kwon et al. |
| 6,335,280 B1 | 1/2002 | van der Jeugd |
| 6,342,277 B1 | 1/2002 | Sherman |
| 6,346,477 B1 | 2/2002 | Kaloyeros et al. |
| 6,348,376 B2 | 2/2002 | Lim et al. |
| 6,355,561 B1 | 3/2002 | Sandhu et al. |
| 6,358,829 B2 | 3/2002 | Yoon et al. |
| 6,365,502 B1 | 4/2002 | Paranjpe et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,447,607 B2 | 9/2002 | Soininen et al. |
| 6,447,933 B1 | 9/2002 | Wang et al. |
| 6,451,119 B2 | 9/2002 | Sneh et al. |
| 6,451,695 B2 | 9/2002 | Sneh |
| 6,454,860 B2 | 9/2002 | Metzner et al. |
| 6,458,701 B1 | 10/2002 | Chae et al. |
| 6,468,924 B2 | 10/2002 | Lee et al. |
| 6,475,276 B1 | 11/2002 | Elers et al. |

| | | | | | | |
|---|---|---|---|---|---|---|
| 6,475,910 | B1 | 11/2002 | Sneh | 2001/0042523 A1 | 11/2001 | Kasala |
| 6,478,872 | B1 | 11/2002 | Chae et al. | 2001/0042799 A1 | 11/2001 | Kim et al. |
| 6,481,945 | B1 | 11/2002 | Hasper et al. | 2001/0050039 A1 | 12/2001 | Park |
| 6,482,262 | B1 | 11/2002 | Elers et al. | 2001/0054377 A1 | 12/2001 | Lindfors et al. |
| 6,482,733 | B2 | 11/2002 | Raaijmakers et al. | 2001/0054730 A1 | 12/2001 | Kim et al. |
| 6,482,740 | B2 | 11/2002 | Soininen et al. | 2001/0054769 A1 | 12/2001 | Raaijmakers et al. |
| 6,495,854 | B1 | 12/2002 | Narwankan et al. | 2002/0000196 A1 | 1/2002 | Park |
| 6,511,539 | B1 | 1/2003 | Raaijmakers | 2002/0000598 A1 | 1/2002 | Kang et al. |
| 6,524,952 | B1 | 2/2003 | Srinivas et al. | 2002/0004293 A1 | 1/2002 | Soininen et al. |
| 6,527,855 | B2 | 3/2003 | De la Rosa et al. | 2002/0007790 A1 | 1/2002 | Park |
| 6,534,395 | B2 | 3/2003 | Werkhoven et al. | 2002/0009544 A1 | 1/2002 | McFeely et al. |
| 6,534,404 | B1 | 4/2003 | Danek et al. | 2002/0009896 A1 | 1/2002 | Sandhu et al. |
| 6,548,112 | B1 | 4/2003 | Hillman et al. | 2002/0017242 A1 | 2/2002 | Hamaguchi et al. |
| 6,548,424 | B2 | 4/2003 | Putkonen | 2002/0019121 A1 | 2/2002 | Pyo |
| 6,551,406 | B2 | 4/2003 | Kilpi | 2002/0020869 A1 | 2/2002 | Park et al. |
| 6,551,929 | B1 | 4/2003 | Kori et al. | 2002/0021544 A1 | 2/2002 | Cho et al. |
| 6,569,501 | B2 | 5/2003 | Chiang et al. | 2002/0031618 A1 | 3/2002 | Sherman |
| 6,572,705 | B1 | 6/2003 | Suntola et al. | 2002/0037630 A1 | 3/2002 | Agarwal et al. |
| 6,578,287 | B2 | 6/2003 | Aswad | 2002/0041931 A1 | 4/2002 | Suntola et al. |
| 6,579,372 | B2 | 6/2003 | Park | 2002/0048635 A1 | 4/2002 | Kim et al. |
| 6,585,823 | B1 | 7/2003 | Van Wijck | 2002/0048880 A1 | 4/2002 | Lee |
| 6,592,728 | B1 | 7/2003 | Paranjpe et al. | 2002/0052097 A1 | 5/2002 | Park |
| 6,593,484 | B2 | 7/2003 | Yasuhara et al. | 2002/0055235 A1 | 5/2002 | Agarwal et al. |
| 6,596,602 | B2 | 7/2003 | Iizuka et al. | 2002/0060363 A1 | 5/2002 | Xi et al. |
| 6,599,572 | B2 | 7/2003 | Saanila et al. | 2002/0061612 A1 | 5/2002 | Sandhu et al. |
| 6,607,976 | B2 | 8/2003 | Chen et al. | 2002/0066411 A1 | 6/2002 | Chiang et al. |
| 6,620,723 | B1 | 9/2003 | Byun et al. | 2002/0068458 A1 | 6/2002 | Chiang et al. |
| 6,630,030 | B1 | 10/2003 | Suntola et al. | 2002/0073924 A1 | 6/2002 | Chiang et al. |
| 6,630,201 | B2 | 10/2003 | Chiang et al. | 2002/0074588 A1 | 6/2002 | Lee et al. |
| 6,632,279 | B1 | 10/2003 | Ritala et al. | 2002/0076481 A1 | 6/2002 | Chiang et al. |
| 6,635,965 | B1 | 10/2003 | Lee et al. | 2002/0076507 A1 | 6/2002 | Chiang et al. |
| 6,660,126 | B2 | 12/2003 | Nguyen et al. | 2002/0076508 A1 | 6/2002 | Chiang et al. |
| 6,686,271 | B2 | 2/2004 | Raaijmakers et al. | 2002/0076837 A1 | 6/2002 | Hujanen et al. |
| 6,692,617 | B1 | 2/2004 | Fu et al. | 2002/0081381 A1 | 6/2002 | De la Rosa et al. |
| 6,716,287 | B1 | 4/2004 | Santiago et al. | 2002/0081844 A1 | 6/2002 | Jeon et al. |
| 6,718,126 | B2 | 4/2004 | Lei | 2002/0086106 A1 | 7/2002 | Park et al. |
| 6,730,197 | B2 | 5/2004 | Wang et al. | 2002/0086111 A1 | 7/2002 | Byun et al. |
| 6,734,020 | B2 | 5/2004 | Lu et al. | 2002/0086507 A1 | 7/2002 | Park et al. |
| 6,743,340 | B2 | 6/2004 | Fu | 2002/0090829 A1 | 7/2002 | Sandhu et al. |
| 6,772,072 | B2 | 8/2004 | Ganguli et al. | 2002/0092471 A1 | 7/2002 | Kang et al. |
| 6,773,507 | B2 | 8/2004 | Jallepally et al. | 2002/0094689 A1 | 7/2002 | Park |
| 6,777,352 | B2 | 8/2004 | Tepman et al. | 2002/0098627 A1 | 7/2002 | Pomarede et al. |
| 6,778,762 | B1 | 8/2004 | Shareef et al. | 2002/0104481 A1 | 8/2002 | Yang et al. |
| 6,784,096 | B2 | 8/2004 | Chen et al. | 2002/0105088 A1 | 8/2002 | Yang et al. |
| 6,790,773 | B1 | 9/2004 | Drewery et al. | 2002/0106536 A1 | 8/2002 | Lee et al. |
| 6,803,272 | B1 | 10/2004 | Halliyal et al. | 2002/0106846 A1 | 8/2002 | Seutter et al. |
| 6,815,285 | B2 | 11/2004 | Choi et al. | 2002/0108570 A1 | 8/2002 | Lindfors |
| 6,818,094 | B2 | 11/2004 | Yudovsky | 2002/0109168 A1 | 8/2002 | Kim et al. |
| 6,821,563 | B2 | 11/2004 | Yudovsky | 2002/0110991 A1 | 8/2002 | Li |
| 6,838,125 | B2 | 1/2005 | Chung et al. | 2002/0115886 A1 | 8/2002 | Yasuhara et al. |
| 6,866,746 | B2 | 3/2005 | Lei et al. | 2002/0117399 A1 | 8/2002 | Chen et al. |
| 6,868,859 | B2 | 3/2005 | Yudovsky | 2002/0121241 A1 | 9/2002 | Nguyen et al. |
| 6,881,437 | B2 | 4/2005 | Ivanov et al. | 2002/0121342 A1 | 9/2002 | Nguyen et al. |
| 6,893,915 | B2 | 5/2005 | Park et al. | 2002/0121697 A1 | 9/2002 | Marsh |
| 6,902,624 | B2 | 6/2005 | Seidel et al. | 2002/0127745 A1 | 9/2002 | Lu et al. |
| 6,921,062 | B2 | 7/2005 | Gregg et al. | 2002/0134307 A1 | 9/2002 | Choi |
| 6,936,528 | B2 | 8/2005 | Koo et al. | 2002/0135071 A1 | 9/2002 | Kang et al. |
| 6,936,538 | B2 | 8/2005 | Byun | 2002/0144655 A1 | 10/2002 | Chiang et al. |
| 6,958,174 | B1 | 10/2005 | Klaus et al. | 2002/0144657 A1 | 10/2002 | Chiang et al. |
| 6,960,284 | B2 | 11/2005 | Fu et al. | 2002/0146511 A1 | 10/2002 | Chiang et al. |
| 2001/0000866 | A1 | 5/2001 | Sneh et al. | 2002/0155722 A1 | 10/2002 | Satta et al. |
| 2001/0002280 | A1 | 5/2001 | Sneh | 2002/0162506 A1 | 11/2002 | Sneh et al. |
| 2001/0009140 | A1 | 7/2001 | Bondestam et al. | 2002/0164421 A1 | 11/2002 | Chiang et al. |
| 2001/0009695 | A1 | 7/2001 | Saanila et al. | 2002/0164423 A1 | 11/2002 | Chiang et al. |
| 2001/0011526 | A1 | 8/2001 | Doering et al. | 2002/0177282 A1 | 11/2002 | Song et al. |
| 2001/0013312 | A1 | 8/2001 | Soininen et al. | 2002/0182320 A1 | 12/2002 | Leskela et al. |
| 2001/0014371 | A1 | 8/2001 | Kilpi | 2002/0187256 A1 | 12/2002 | Elers et al. |
| 2001/0024387 | A1 | 9/2001 | Raaijmakers et al. | 2002/0187631 A1 | 12/2002 | Kim et al. |
| 2001/0025979 | A1 | 10/2001 | Kim et al. | 2002/0197402 A1 | 12/2002 | Chiang et al. |
| 2001/0028924 | A1 | 10/2001 | Sherman | 2002/0197863 A1 | 12/2002 | Mak et al. |
| 2001/0029094 | A1 | 10/2001 | Mee-Young et al. | 2003/0004723 A1 | 1/2003 | Chihara |
| 2001/0034123 | A1 | 10/2001 | Jeon et al. | 2003/0010451 A1 | 1/2003 | Tzu et al. |
| 2001/0041250 | A1 | 11/2001 | Werkhoven | 2003/0013300 A1 | 1/2003 | Byun |

| | | |
|---|---|---|
| 2003/0013320 A1 | 1/2003 | Kim et al. |
| 2003/0015421 A1 | 1/2003 | Chan et al. |
| 2003/0017697 A1 | 1/2003 | Choi et al. |
| 2003/0019745 A1 | 1/2003 | Wang et al. |
| 2003/0022338 A1 | 1/2003 | Ruben et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhang et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0089308 A1 | 5/2003 | Raaijmakers |
| 2003/0101927 A1 | 6/2003 | Raaijmakers et al. |
| 2003/0101938 A1 | 6/2003 | Ronsse et al. |
| 2003/0104126 A1 | 6/2003 | Fang et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0129826 A1 | 7/2003 | Werkhoven et al. |
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0143841 A1 | 7/2003 | Yang et al. |
| 2003/0146084 A1 | 8/2003 | Fu |
| 2003/0153177 A1 | 8/2003 | Tepman et al. |
| 2003/0153181 A1 | 8/2003 | Yoon et al. |
| 2003/0161952 A1 | 8/2003 | Wang et al. |
| 2003/0165615 A1 | 9/2003 | Aaltonen et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0198754 A1 | 10/2003 | Xi et al. |
| 2003/0203616 A1 | 10/2003 | Chung et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224217 A1 | 12/2003 | Byun et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0041320 A1 | 3/2004 | Hodumi |
| 2004/0043630 A1 | 3/2004 | Vaartstra et al. |
| 2004/0046197 A1 | 3/2004 | Basceri et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0077158 A1 | 4/2004 | Um et al. |
| 2004/0077183 A1 | 4/2004 | Chung et al. |
| 2004/0105934 A1 | 6/2004 | Chang et al. |
| 2004/0140205 A1 | 7/2004 | Fu et al. |
| 2004/0144308 A1 | 7/2004 | Yudovsky |
| 2004/0144311 A1 | 7/2004 | Chen et al. |
| 2004/0187304 A1 | 9/2004 | Chen et al. |
| 2004/0203233 A1 | 10/2004 | Kang et al. |
| 2004/0203254 A1 | 10/2004 | Conley, Jr. et al. |
| 2004/0211665 A1 | 10/2004 | Yoon et al. |
| 2004/0216998 A1 | 11/2004 | Fu |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0253375 A1 | 12/2004 | Ivanov et al. |
| 2004/0256351 A1 | 12/2004 | Chung et al. |
| 2005/0006799 A1 | 1/2005 | Gregg et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0095859 A1 | 5/2005 | Chen et al. |
| 2005/0104142 A1 | 5/2005 | Narayanan et al. |
| 2005/0153571 A1 | 7/2005 | Senzaki |
| 2005/0196960 A1 | 9/2005 | Koo et al. |
| 2005/0220998 A1 | 10/2005 | Chang et al. |
| 2005/0233156 A1 | 10/2005 | Senzaki et al. |
| 2005/0255243 A1 | 11/2005 | Senzaki |
| 2006/0033678 A1 | 2/2006 | Lubomirsky et al. |

FOREIGN PATENT DOCUMENTS

| | | |
|---|---|---|
| EP | 0 703 598 | 3/1996 |
| EP | 0 799 903 | 10/1997 |
| EP | 1 091 016 | 4/2001 |
| EP | 1 146 548 | 10/2001 |
| EP | 1 167 569 | 1/2002 |
| GB | 2 355 727 | 5/2001 |
| JP | 58-098917 | 6/1983 |
| JP | 61-174725 | 8/1986 |
| JP | 64-28921 | 1/1989 |
| JP | 02-246161 | 9/1990 |
| JP | 2-298263 | 12/1990 |
| JP | 3-140487 | 6/1991 |
| JP | 3-240944 | 10/1991 |
| JP | 04-291916 | 9/1992 |
| JP | 5-195213 | 8/1993 |
| JP | 05-206036 | 8/1993 |
| JP | 05-234899 | 9/1993 |
| JP | 05-270997 | 10/1993 |
| JP | 5-311419 | 11/1993 |
| JP | 06-224138 | 5/1994 |

| | | |
|---|---|---|
| JP | 7-126844 | 5/1995 |
| JP | 07-300649 | 11/1995 |
| JP | 05-047666 | 2/1996 |
| JP | 08-060355 | 3/1996 |
| JP | 10-308283 | 11/1998 |
| JP | 11-195620 | 7/1999 |
| JP | 2000-031387 | 1/2000 |
| JP | 2000-058777 | 2/2000 |
| JP | 2000-319772 | 3/2000 |
| JP | 2000-178735 | 6/2000 |
| JP | 2001-020075 | 11/2000 |
| JP | 2001-95821 | 4/2001 |
| JP | 2001-111000 | 4/2001 |
| JP | 2001-172767 | 6/2001 |
| JP | 2001-220294 | 8/2001 |
| JP | 2001-254181 | 9/2001 |
| JP | 2000-212752 | 11/2002 |
| WO | WO 96/17107 | 6/1996 |
| WO | WO 98/51838 | 11/1998 |
| WO | WO 99/01595 | 1/1999 |
| WO | WO 99/29924 | 6/1999 |
| WO | WO 00/30156 | 11/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 02/01628 | 1/2002 |
| WO | WO 02/08485 | 1/2002 |
| WO | WO 02/08488 | 1/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO 02/67319 | 6/2002 |
| WO | WO 03/23835 | 3/2003 |
| WO | WO 04/08491 | 1/2004 |

OTHER PUBLICATIONS

Asamaki et al. " Copper Self-Sputtering by Planar Magnetron," Japanese Journal of Applied Physics, vol. 33, (1994), Part 1, No. 5A, May 1994, pp. 2500-2503.

Asamaki et al. "Filing of Sub-μm Through-holes by Self-sputter Deposition," Japanese Journal of Applied Physics, vol. 33, (1994), Part 1, No. 8, Aug. 1999, pp. 4566-4569.

Byun, et al. "Effect of Deposition Temperature and Sputtering Ambient on In Situ Cobalt Silicide Formation," J. Electrochem. Soc., vol. 144, No. 9, (Sep. 1997), pp. 3175-3179.

Cameron, et al. "Atomic Layer Deposition of $SiO_2$ and $TiO_2$ in Alumina Tubular Membranes: Pore Reduction and Effect of Surface Species on Gas Transport," Langmuir, vol. 16, No. 19, American Chemical Society, 2000, pp. 7435-7444.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670, (2001), pp. K2.2.1-K2.2.6.

Dormans, et al. "OMCVD of cobalt and cobalt silicide," Journal of Crystal Growth 114, (1991), Elsevier Publishers B.V., pp. 364-372.

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461), 2001.

Elam, et al. "Nucleation and Growth During Tungsten Atomic Layer Deposition on $SiO_2$ Surfaces," Thin Solid Films, 386, (2001), pp. 41-52.

George, et al. "Surface Chemistry for Atomic Layer Growth," J. Phys. Chem. 1996, 100, pp. 13121-13131.

Goswami, et al. Transition Metals Show Promise as Copper Barriers, Semiconductor International, ATMI, San Jose—May 1, 2004, Semiconductor International, pp. 1-7.

Hong, et al. "Characteristics of PAALD-TaN thin films derived from TAIMATA precursor for copper metallization," Interconnect Technology Conference, 2004, Proceedings of the IEEE 2004 International, Jun. 7-9, 2004, pp. 9-11.

Hwang, et al. "Nanometer-Size α-$PbO_2$-type $TiO_2$ in Garnet: A Thermobarometer for Ultrahigh-Pressure Metamorphism," Science vol. 288, (Apr. 14, 2000), pp. 321-324.

Inoue, et al. "A New Cobalt Salicide Technology for 0.15μm CMOS Devices," IEEE Transactions on Electron Devices, vol. 45, No. 11, (Nov. 1998), pp. 2312-2318.

Johnson "Magnetoelectronic memories last and last . . . " IEEE Spectrum, Feb. 2000, pp. 33-40.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, pp. 3828-3831.

Klaus, et al, "Atomic Layer Deposition of $SiO_2$ Using Catalyzed and Uncatalyzed Self-Limiting Surface Reactions," Surface Review and Letters, vol. 6, Nos. 3 & 4, (1999), pp. 435-448.

Klaus, et al. "Atomically Controlled Growth of Tungsten and Tungsten Nitride Using Sequential Surface Reactions," Applied Surface Science, 162-163 (2000), pp. 479-491.

Kotaki et al. "Novel Oxygen Free Titanium Silicidation (OFS) Processing For Low Resistance and Termally Stable Salicide (Self-Aligned Silicide) in Deep Submicron Dual Gate CMOS, (Complementary Metal-Oxide Semiconductors)", Jpn. J. Appl. Phys. vol. 34 (1995), Part 1, No. 2B, Feb. 1995, pp. 776-781.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films From $Ta(OC_2H_5)_5$ and $H_2O_1$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," Nanostructured Materials, vol. 8, No. 7, Elsevier Science Ltd., 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; pp. 300-306.

Kukli, et al. "Tailoring the Dielectric Properties of $HfO_2$-$Ta_2$-$O_5$ Nanolaminates," Applied Physics Letters, vol. 68, No. 26, Jun. 24, 1996; pp. 3737-3739.

Lee, et al. "Excellent conformal deposition obtained of pure Co Films by MOCVD using $Co_2(CO)_8$ as a Co precursor," http:/www.samsung.com/AboutSamsung.ElectronicsGlobal/SocialCommitment/HumantechThese/WinningPapers/downloads/11th/silverproze/LeeJeongGil.pdf.

Lee, et al. "Pulsed Nucleation for Ultra-High Aspect Ratio Tungsten Plugfill," Materials Research Society, 2002, pp. 649-653.

Lim, et al. "Atomic layer deposition of transition metals," Nature Materials, vol. 2, Nov. 2003, pp. 749-754.

Liu et al. "New rare-earth permanent magnets with an intrinsic coercivity of 10 kOe at 500° C.," Journal of Applied Physics, vol. 85, No. 8, Apr. 15, 1999, pp. 5660-5662.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Min, et al. "Atomic Layer Deposition of TiN Thin Films by Sequential Introduction of Ti Precursor and $NH_3$," Mat. Res. Soc. Symp. Proc. vol. 514 (1998), pp. 337-343.

Min, et al. "Chemical Vapor Deposition of Ti-Si-N Films With Alternating Source Supply," Mat. Rec. Soc. Symp. Proc. vol. (1999), pp. 207-210.

Min, et al. "Metal-organic Atomic-layer Deposition of Titanium-silicon-nitride films," Applied Physics Letters, vol. 75, No. 11 (Sep. 13, 1999), pp. 1521-1523.

Murarka et al., "Copper Metallization for ULSI and Beyond," Critical Reviews in Solid State and Materials Sciences, vol. 20, No. 2, (1995) pp. 87-124.

Niinisto, et al. "Synthesis of Oxide Thin Films and Overlayers by Atomic Layer Epitaxy for Advanced Applications," Materials Science and Engineering B41 (1996) pp. 23-29.

Park, et al. "Performance improvement of MOSFET with $HfO_2$-$Al_2O_3$ laminate gate dielectric and CVD-TaN metal gate deposited by TAIMATA," Electron Devices Meeting, 2003, IEDM '03 Technical Digest. IEEE International Dec. 8-10, 2003, pp. 13.6.1-13.6.4.

Parkin et al. "Exchange-biased magnetic tunnel junctions and application to nonvolatile magnetic random access memory (invited)," Journal of Applied Physics, vol. 85, No. 8, Apr. 15, 1999, pp. 5828-5833.

PCT International Partial Search Report for International Application No. PCT/US02/23578 dated Apr. 15, 2004.

PCT International Search Report for International Application No. PCT/US02/23578 dated Jul. 8, 2004.

PCT International Written Opinion for International Application No. PCT/US02/23578 dated Feb. 11, 2005.

Posadowski et al. "Sustained self-sputtering using a direct current magnetron source," Journal of Vacuum Science and Technology, A vol. 11, No. 6, Nov./Dec. (1993), pp. 2980-2984.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998), pp. 2914-2920.

Ritala, et al. "Atomic Layer Epitacxy Growth of TiN Thin Films," J. Electrochem. Soc., vol. 142, No. 8, Aug. 1995, pp. 2731-2737.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993), pp. 288-295.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Shenai, et al. "Correlation of vapor pressure equation and film properties with trimethylindium purity for the MOVPE grown III-V compounds," Journal of Crystal Growth 248 (2003), pp. 91-98.

Tehrani et al., "High density submicron magnetoresisitive random access memory (invited)," Journal of Applied Physics, vol. 85, No. 8, Apr. 15, 1999, pp. 5822-5827.

Yang, et al. "Atomic Layer Deposition of Tungsten Film from $WF_6$/$B_2H_6$: Nucleation Layer for Advanced Semiconductor Devices," Conference Proceedings ULSI XVII (2002), Materials Research Society, pp. 655-660.

Yun, et al. "Highly Scalable PVD/CVD-Cobalt Bilayer Salicidation Technology for sub-50nm CMOSFETs," no date given.

Zorpette, "The Quest for the SP", IEEE Spectrum, Dec. 2001, pp. 30-35.

* cited by examiner

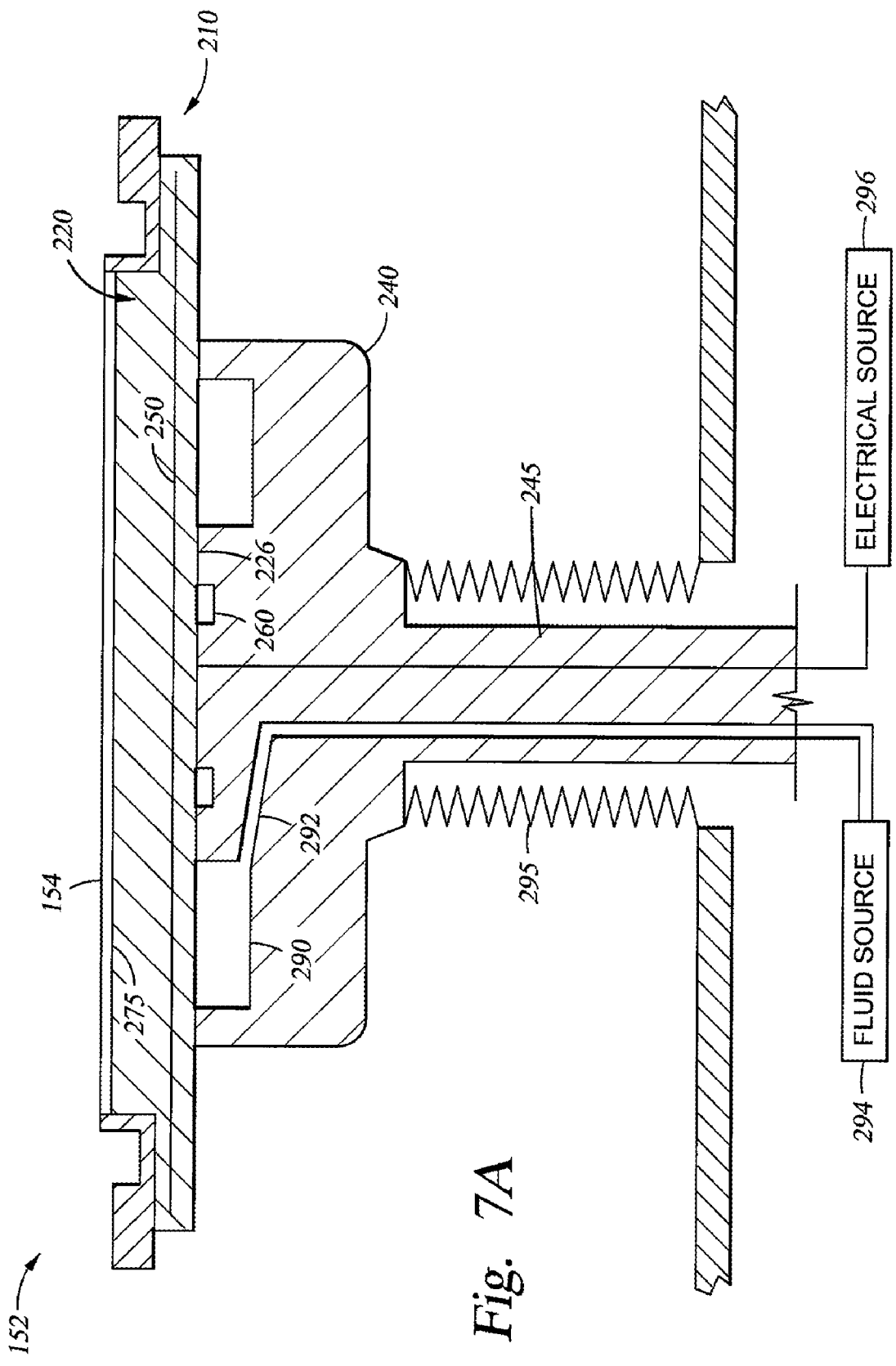

DEPOSITION METHODS FOR BARRIER AND TUNGSTEN MATERIALS

CROSS-REFERENCE TO RELATED APPLICATIONS

This application is a continuation of U.S. Ser. No. 10/845,970, filed on May 14, 2004 now abandoned, which is a continuation of U.S. Ser. No. 10/044,412, filed on Jan. 9, 2002, and issued as U.S. Pat. No. 6,740,585, which is a continuation-in-part of U.S. Ser. No. 09/916,234, which was filed on Jul. 25, 2001, now abandoned, which are all herein incorporated by reference in their entirety.

BACKGROUND OF THE INVENTION

1. Field of the Invention

The present invention relates to the fabrication of semiconductor devices and to the apparatus and methods for deposition and annealing of materials on a semiconductor substrate.

2. Description of the Related Art

Recent improvements in circuitry of ultra-large scale integration (ULSI) on semiconductor substrates indicate that future generations of semiconductor devices will require sub-quarter micron multi-level metallization. The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die as features decrease below 0.13 μm in size.

ULSI circuits include metal oxide semiconductor (MOS) devices, such as complementary metal oxide semiconductor (CMOS) field effect transistors (FETs). The transistors can include semiconductor gates disposed between source and drain regions. In the formation of integrated circuit structures, and particularly in the formation of MOS devices using polysilicon gate electrodes, it has become the practice to provide a metal silicide layer over the polysilicon gate electrode, and over the source and drain regions of the silicon substrate, to facilitate lower resistance and improve device performance by electrically connecting the source and drain regions to metal interconnects.

One important processing technique currently used in CMOS processing technology is the Self-Aligned Silicidation (salicide) of refractory metals such as titanium and cobalt. In a salicide process using cobalt (Co), for example, the source and drain and polysilicon gate resistances are reduced by forming a high conductivity overlayer and the contact resistance is reduced by increasing the effective contact area of the source and drain with subsequently formed metal interconnects. Salicide processing technology seeks to exploit the principle that a refractory metal such as cobalt deposited on a patterned silicon substrate will selectively react with exposed silicon under specific processing conditions, and will not react with adjacent materials, such as silicon oxide material.

For example, a layer of cobalt is sputtered onto silicon, typically patterned on a substrate surface, and then subjected to a thermal annealing process to form cobalt silicide (CoSi). Unreacted cobalt, such as cobalt deposited outside the patterned silicon or on a protective layer of silicon oxide, can thereafter be selectively etched away. The selective etching of cobalt silicide will result in maskless, self-aligned formation of a low-resistivity refractory metal silicide in source, drain, and polysilicon gate regions formed on the substrate surface and in interconnecting conductors of the semiconductor device. After the etch process, further processing of the substrate may occur, such as additional thermal annealing, which may be used to further reduce the sheet resistance of the silicide material and complete formation of cobalt silicide ($CoSi_2$).

However, it has been difficult to integrate cobalt silicide processes into conventional manufacturing equipment. Current processing systems performing cobalt silicide processes require transfer of the substrate between separate chambers for the deposition and annealing process steps. Transfer between chambers may expose the substrate to contamination and potential oxidation of silicon or cobalt deposited on the substrate surface.

Oxide formation on the surface of the substrate can result in increasing the resistance of silicide layers as well as reducing the reliability of the overall circuit. For example, oxidation of the deposited cobalt material may result in cobalt agglomeration and irregular growth of the cobalt silicide layer. The agglomeration and irregular growth of the cobalt silicide layer may result in device malformation, such as source and drain electrodes having different thicknesses and surface areas. Additionally, excess cobalt silicide growth on substrate surface may form conductive paths between devices, which may result in short circuits and device failure.

One solution to limiting cobalt and silicon contamination has been to sputter a capping film of titanium and/or titanium nitride on the cobalt and silicon film prior to transferring the substrate between processing systems. The capping film is then removed after annealing the substrate and prior to further processing of the substrate. However, the addition of titanium and titanium nitride deposition and removal processes increases the number of processing steps required for silicide formation, thereby reducing process efficiency, increasing processing complexity, and reducing substrate throughput.

ULSI circuits also include the formation of interconnects or contacts between conductive layers, such as the cobalt silicide layer described above and a copper feature. Interconnects or contacts generally comprise a feature definition formed in a dielectric material, such as silicon oxide, a barrier layer deposited on the feature definition, and a metal layer fill or "plug" of the feature definition. Titanium and titanium nitride films have been used as barrier layer material for the metal layer, such as tungsten, and the films are generally deposited by a physical vapor deposition technique. However, deposition of titanium over silicon surfaces presents the problem of titanium silicide formation.

Titanium silicide has been observed to agglomerate, which detrimentally affects subsequently deposited materials. Also, titanium silicide exhibits a radical increase in sheet resistance as feature sizes decrease below 0.17 μm, which detrimentally affects the conductance of the feature being formed. Further, titanium silicide has an insufficient thermal stability during processing of the substrate at temperatures of about 400° C. or higher, which can result in interlayer diffusion and detrimentally affect device performance.

Additionally, titanium and titanium nitride PVD deposition often occur at extremely low processing pressures, i.e., less than $5 \times 10^{-3}$ Torr, compared with CVD deposition of materials such as tungsten, which may be deposited as high as about 300 Torr. This results in difficult integration of PVD and CVD processes in the same system. This has resulted in many manufactures using separate systems for the PVD titanium and titanium nitride deposition and the CVD tungsten deposition. The increase in the number of systems results in increased production costs, increased production times, and exposes the processed substrate to contamination when transferred between systems.

Therefore, there is a need for a method and apparatus for forming barrier layers and silicide materials on a substrate while reducing processing complexity and improving processing efficiency and throughput.

SUMMARY OF THE INVENTION

Embodiments of the invention described herein generally provide methods and apparatus for forming a metal barrier or a metal silicide layer using a deposition and/or annealing process. In one aspect, a system is provided for processing a substrate including a load lock chamber, an intermediate substrate transfer region comprising a first substrate transfer chamber and a second substrate transfer chamber, wherein the first substrate transfer chamber is operated at a first pressure and the second substrate transfer chamber is operated at a second pressure less than the first pressure and the first substrate transfer chamber is coupled to the load lock chamber and the second substrate transfer chamber is coupled to the first substrate transfer chamber, at least one physical vapor deposition (PVD) processing chamber coupled to the first substrate transfer chamber, at least one chemical vapor deposition (CVD) processing chamber coupled to the second substrate transfer chamber, and at least one annealing chamber coupled to the second substrate transfer chamber.

In another aspect, a method is provided for processing a substrate including positioning a substrate having a silicon material disposed thereon with patterned feature definitions formed therein in a substrate processing system, depositing a first metal layer on the substrate surface in a first processing chamber disposed on the processing system by a physical vapor deposition technique, a chemical vapor deposition technique or an atomic layer deposition technique, forming a metal silicide layer by reacting the silicon material and the first metal layer, and depositing a second metal layer in situ on the substrate in a second processing chamber disposed on the processing system by a chemical vapor deposition technique.

In another aspect, a method is provided for processing a substrate including positioning a substrate having feature definitions formed in a silicon-containing material in a substrate processing system, depositing a metal layer on the silicon-containing material in the feature definitions, wherein the metal layer comprises cobalt, nickel, or combinations thereof, and depositing a tungsten layer on the metal layer by a chemical vapor deposition technique at a temperature sufficient to form a metal silicide layer at an interface of the silicon-containing material and the metal layer.

In another aspect, a method is provided for processing a substrate including positioning a substrate having feature definitions formed in a silicon-containing material in a substrate processing system, depositing a metal layer on the silicon-containing material in the feature definitions in a physical vapor deposition chamber, annealing the substrate in the physical vapor deposition chamber to form a metal silicide layer at an interface of the silicon-containing material and the metal layer, annealing the substrate to substantially convert the metal layer to metal silicide, and depositing a tungsten layer on the metal layer in a chemical vapor deposition chamber.

In another aspect, a method is provided for processing a substrate including positioning a substrate having a silicon material disposed thereon with patterned feature definitions formed therein in a first processing chamber, exposing the substrate to a plasma cleaning process in a first processing chamber, depositing a cobalt layer on the substrate surface and in the feature definitions by a physical vapor deposition technique in a second processing chamber, annealing the substrate at a first temperature in the second processing chamber to partially form a cobalt silicide layer, annealing the substrate at a second temperature greater than the first temperature in a third processing chamber to substantially form the cobalt silicide layer, and depositing a tungsten layer on the cobalt silicide layer by a chemical vapor deposition technique in a fourth processing chamber, wherein the first, second, third, and fourth processing chambers are disposed on one vacuum processing system.

In another aspect, a method is provided for processing a substrate including positioning a substrate having feature definitions formed in a silicon-containing material in a substrate processing system, depositing a metal layer on the silicon-containing material in the feature definitions, wherein the metal layer comprises cobalt, nickel, or combinations thereof, annealing the substrate at a first temperature to form a metal silicide layer, depositing a tungsten layer on the metal layer by a chemical vapor deposition technique, and annealing the substrate at a second temperature greater than the first temperature.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 7A is a cross-sectional view of one embodiment of a pedestal for annealing a substrate;

DETAILED DESCRIPTION OF THE PREFERRED EMBODIMENT

Embodiments of the invention described herein provide methods and apparatus for forming a metal silicide layer in a deposition chamber or substrate processing system. One embodiment described below in reference to a physical vapor deposition (PVD) process is provided to illustrate the invention, and should not be construed or interpreted as limiting the scope of the invention. Aspects of the invention may be used to advantage in other processes, such as chemical vapor deposition, in which an anneal is desired for forming metal silicide layers.

Figure 1:
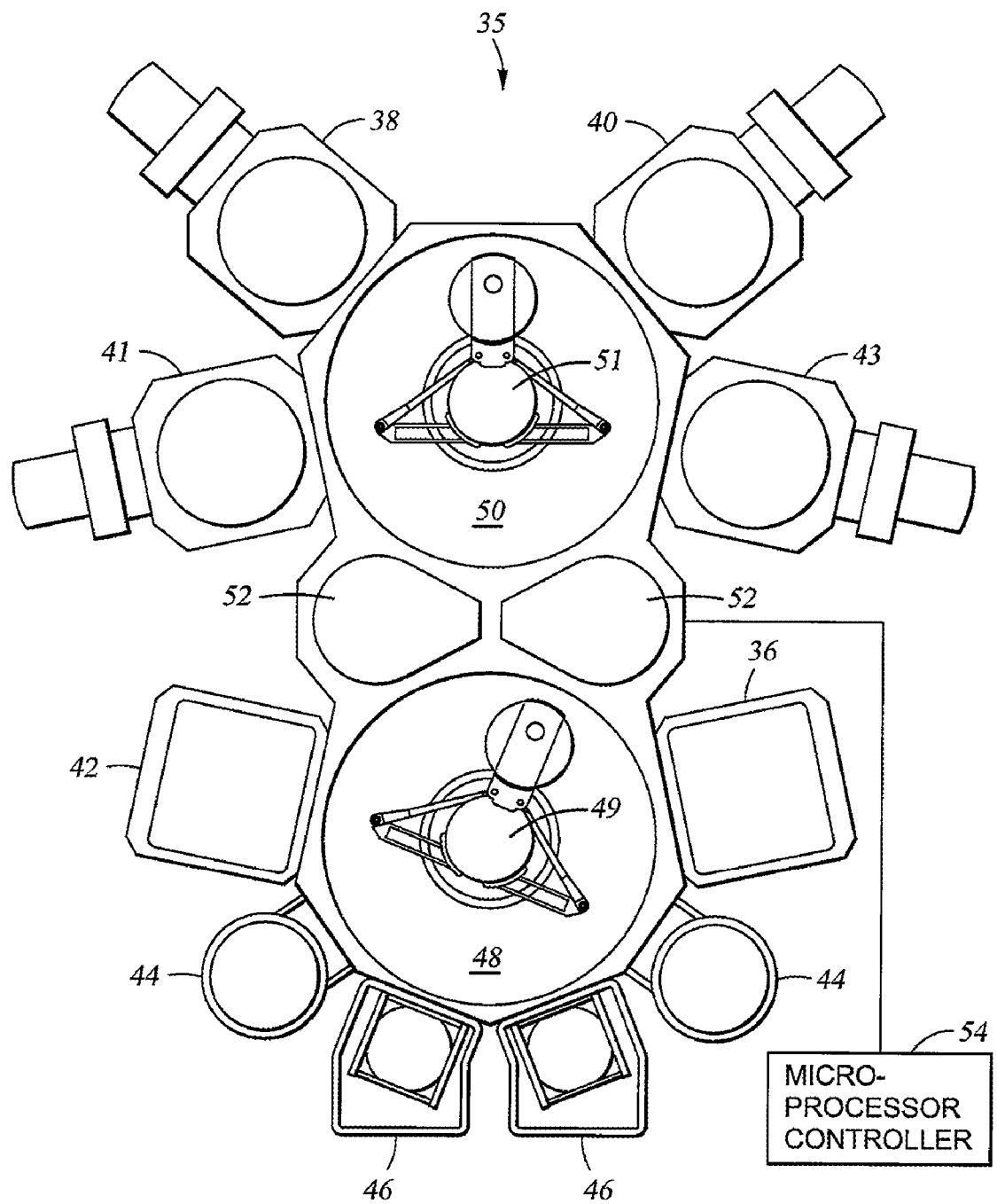
FIG. 1 is schematic top view of one embodiment of an integrated multi-chamber apparatus.

FIG. 1 shows an integrated multi-chamber substrate processing system suitable for performing at least one embodiment of the physical vapor deposition, the chemical vapor deposition, and annealing processes described herein. The deposition and annealing processes may be performed in a multi-chamber processing system or cluster tool having a PVD chamber and a CVD chamber disposed thereon. One processing platform that may be used to advantage is an ENDURA® processing platform commercially available from Applied Materials, Inc., located in Santa Clara, Calif.

FIG. 1 is a schematic top view of one embodiment of a processing platform 35 including two transfer chambers 48, 50, transfer robots 49, 51, disposed in transfer chambers 48, 50 respectfully, and a plurality of processing chambers 36, 38, 40, 41, 42 and 43, disposed on the two transfer chambers 48, 50. The first transfer chamber 48 and the second transfer chamber 50 are separated by pass-through chambers 52, which may comprise cool-down or pre-heating chambers. Pass-through chambers 52 also may be pumped down or ventilated during substrate handling when the first transfer chamber 48 and the second transfer chamber 50 operate at different pressures. For example, the first transfer chamber 48 may operate between about 100 milliTorr and about 5 Torr, such as about 400 milliTorr, and the second transfer chamber 50 may operate between about $1 \times 10^{-5}$ Torr and about $1 \times 10^{-8}$ Torr, such as about $1 \times 10^{-7}$ Torr. The processing platform 35 is automated by programming a microprocessor controller 54.

The first transfer chamber 48 is coupled with two degas chambers 44, two load lock chambers 46, a reactive pre-clean chamber 42, at least one physical vapor deposition chamber, preferably a long throw physical vapor deposition (PVD) chamber 36, and the pass-through chambers 52. The pre-clean chamber 42 may be a PreClean II chamber, commercially available from Applied Materials, Inc., of Santa Clara, Calif. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 49 moves the substrate between the degas chambers 44 and the pre-clean chamber 42. The substrate may then be transferred to the long throw PVD chamber 36 for deposition of a material thereon.

The second transfer chamber 50 is coupled to a cluster of process chambers 38, 40, 41, and 43. Chambers 38 and 40 may be chemical vapor deposition (CVD) chambers for depositing materials, such as tungsten, as desired by the operator. An example of a suitable CVD chamber includes WXZ™ chambers, commercially available from Applied Materials, Inc., located in Santa Clara, Calif. The CVD chambers are preferably adapted to deposit materials by atomic layer deposition (ALD) techniques as well as by conventional chemical vapor deposition techniques. Chambers 41 and 43 may be Rapid Thermal Annealing (RTA) chambers, or Rapid Thermal Process (RTP) chambers, that can anneal substrates at low or extremely low pressures. An example of an RTA chamber is a RADIANCE® chamber, commercially available from Applied Materials, Inc., Santa Clara, Calif. Alternatively, the chambers 41 and 43 may be WXZ™ deposition chambers capable of performing high temperature CVD deposition, annealing processes, or in situ deposition and annealing processes. The PVD processed substrates are moved from transfer chamber 48 into transfer chamber 50 via pass-through chambers 52. Thereafter, transfer robot 51 moves the substrates between one or more of the process chambers 38, 40, 41, and 43 for material deposition and annealing as required for processing.

RTA chambers (not shown) may also be disposed on the first transfer chamber 48 of the processing platform 35 to provide post deposition annealing processes prior to substrate removal from the platform 35 or transfer to the second transfer chamber 50.

While not shown, a plurality of vacuum pumps is disposed in fluid communication with each transfer chamber and each of the processing chambers to independently regulate pressures in the respective chambers. The pumps may establish a vacuum gradient of increasing pressure across the apparatus from the load lock chamber to the processing chambers.

Alternatively, a plasma etch chamber, such as a Decoupled Plasma Source chamber (DPS® chamber) manufactured by Applied Materials, Inc., of Santa Clara, Calif., may be coupled to the processing platform 35 or in a separate processing system for etching the substrate surface to remove unreacted metal after PVD metal deposition and/or annealing of the deposited metal. For example in forming cobalt silicide from cobalt and silicon material by an annealing process, the etch chamber may be used to remove unreacted cobalt material from the substrate surface. The invention also contemplates the use of other etch processes and apparatus, such as a wet etch chamber, used in conjunction with the process and apparatus described herein.

Figure 2:
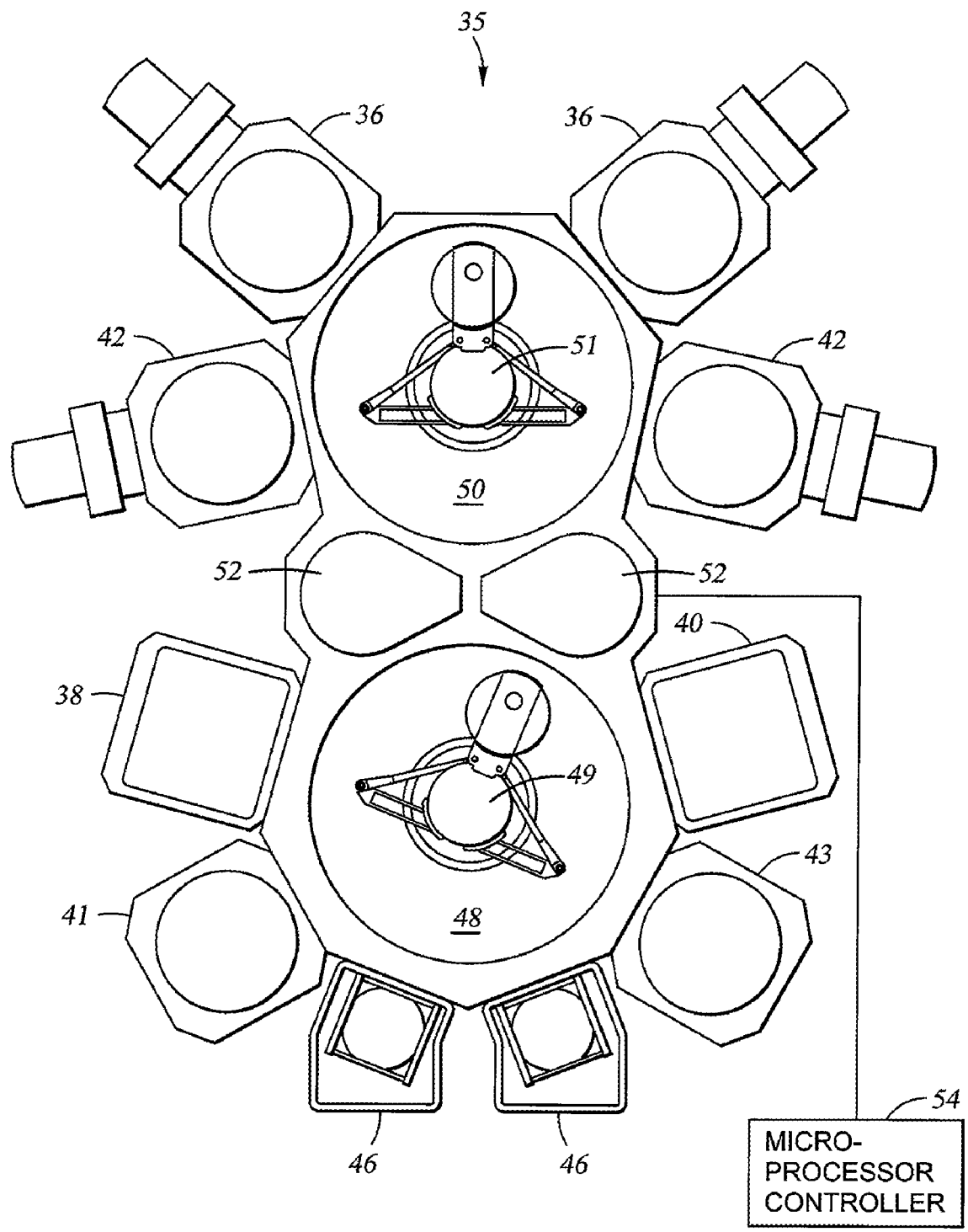
FIG. 2 is schematic top view of another embodiment of an integrated multi-chamber apparatus.

FIG. 2 is a schematic top view of another embodiment of an integrated multi-chamber substrate processing system 35 suitable for performing at least one embodiment of the physical vapor deposition, chemical vapor deposition, and annealing processes described herein. In this embodiment, the first transfer chamber 48 is coupled to a cluster of process chambers 38, 40, 41, and 43, two load lock chambers 46, and pass-through chambers 52. Chambers 41 and 43 may be RTA chambers that can anneal substrates at low or extremely low pressures, such as the RADIANCE® chamber, and chambers 38 and 40 are CVD chambers, such as WXZ™ chambers. The first transfer chamber 48 may operate between about $1 \times 10^{-5}$ Torr and about $1 \times 10^{-8}$ Torr, such as about $1 \times 10^{-7}$ Torr, and the second transfer chamber 50 may operate between about 100 milliTorr and about 5 Torr, such as about 400 milliTorr.

Alternatively, chambers 41 and 43 may be WXZ™ chambers capable of performing high temperature CVD deposition, annealing processes, or in situ deposition and annealing processes. The pass-through chambers 52 may additionally perform as degas chambers in addition to performing heating, cooling, and transporting functions.

The second transfer chamber 50 is coupled to reactive pre-clean chambers 42, one or more long throw physical vapor deposition (PVD) chambers 36, and pass-through chambers 52. The second transfer chamber 50 configuration allows for substrate pre-cleaning, such as by a plasma clean method, and PVD deposition at a vacuum pressure of $1 \times 10^{-8}$ Torr prior to transfer to a higher pressure transfer chamber 48. The first transfer configuration allows higher pressure processing, such as annealing, compared to PVD processing, to be performed in the transfer chamber adjacent the loadlocks 46 and prior to substrate removal. The higher pressure first transfer chamber in this embodiment allows for reduced pump down times and reduced equipment costs compared to configuration of system 35 using a near vacuum pressure, such as between about $1 \times 10^{-5}$ Torr and about $1 \times 10^{-8}$ Torr, at the first transfer chamber 48.

Figure 3:
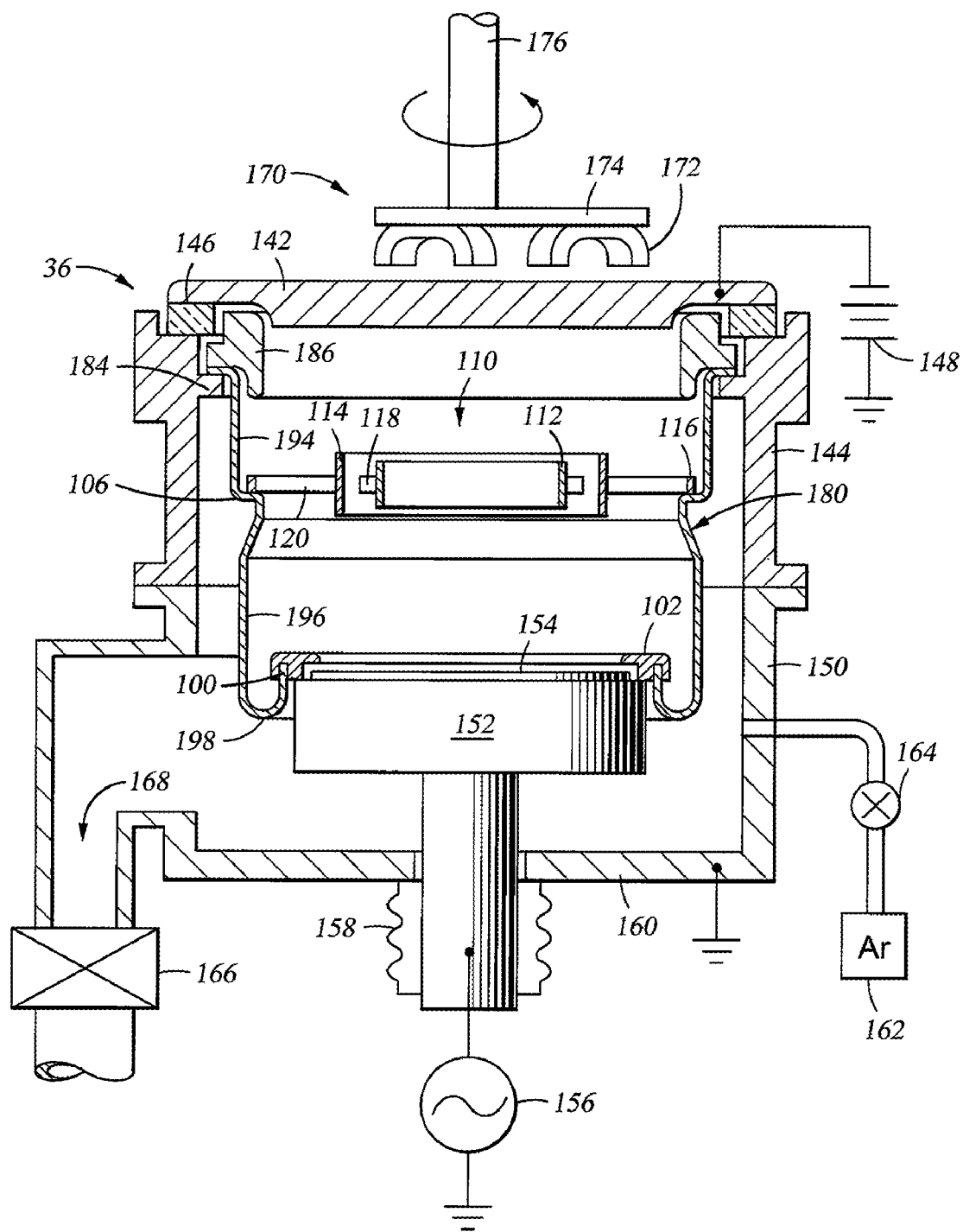
FIG. 3 is a cross-sectional view of one embodiment of a sputtering chamber included within the invention.

FIG. 3 illustrates one embodiment of a long throw physical vapor deposition chamber 36. Example of suitable long throw PVD chambers are ALPS® plus and SIP ENCORE™ PVD processing chambers, both commercially available from Applied Materials, Inc., Santa Clara, Calif.

Generally, the long throw PVD chamber 36 contains a sputtering source, such as a target 142, and a substrate support pedestal 152 for receiving a semiconductor substrate 154 thereon and located within a grounded enclosure wall 150, which may be a chamber wall as shown or a grounded shield.

The chamber 36 includes a target 142 supported on and sealed, as by O-rings (not shown), to a grounded conductive aluminum adapter 144 through a dielectric isolator 146. The target 142 comprises the material to be deposited on the substrate 154 surface during sputtering, and may include cobalt, titanium, tantalum, tungsten, molybdenum, platinum, nickel, iron, niobium, palladium, and combinations thereof, which are used in forming metal silicide layers. For example, elemental cobalt, nickel cobalt alloys, cobalt tungsten alloys, cobalt nickel tungsten alloys, doped cobalt and nickel alloys, or nickel iron alloys may be deposited by using alloy targets or multiple targets in the chamber. The target 142 may also include a bonded composite of a metallic surface layer and a backing plate of a more workable metal.

A pedestal 152 supports a substrate 154 to be sputter coated in planar opposition to the principal face of the target 142. The substrate support pedestal 152 has a planar substrate-receiving surface disposed generally parallel to the sputtering surface of the target 142. The pedestal 152 is vertically movable through a bellows 158 connected to a bottom chamber wall 160 to allow the substrate 154 to be transferred onto the pedestal 152 through a load lock valve (not shown) in the lower portion of the chamber 36 and thereafter raised to a deposition position. Processing gas is supplied from a gas source 162 through a mass flow controller 164 into the lower part of the chamber 36.

A controllable DC power source 148 coupled to the chamber 36 may be used to apply a negative voltage or bias to the target 142. An RF power supply 156 may be connected to the pedestal 152 in order to induce a negative DC self-bias on the substrate 154, but in other applications the pedestal 152 is grounded or left electrically floating.

A rotatable magnetron 170 is positioned in back of the target 142 and includes a plurality of horseshoe magnets 172 supported by a base plate 174 connected to a rotation shaft 176 coincident with the central axis of the chamber 36 and the substrate 154. The horseshoe magnets 172 are arranged in closed pattern typically having a kidney shape. The magnets 172 produce a magnetic field within the chamber 36, generally parallel and close to the front face of the target 142 to trap electrons and thereby increase the local plasma density, which in turn increases the sputtering rate. The magnets 172 produce an electromagnetic field around the top of the chamber 36, and magnets 172 are rotated to rotate the electromagnetic field which influences the plasma density of the process to more uniformly sputter the target 142.

Figure 4:
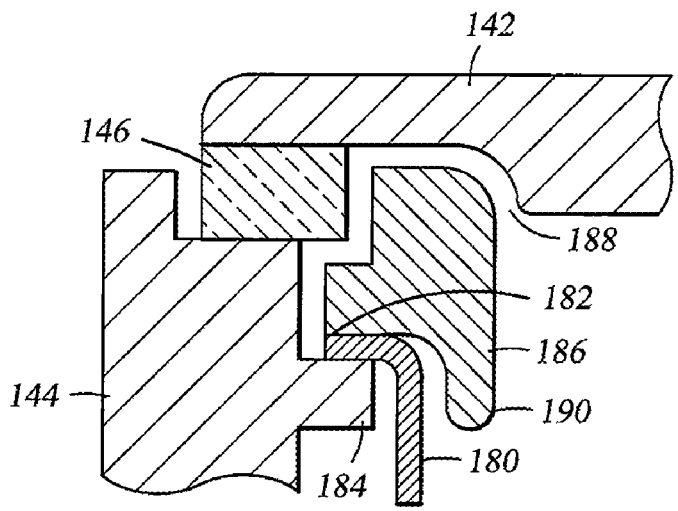
FIG. 4 is an expanded view of FIG. 3 including the upper area of the shields near the target.

The chamber 36 of the invention includes a grounded bottom shield 180 having, as is more clearly illustrated in the exploded cross-sectional view of FIG. 4, an upper flange 182 supported on and electrically connected to a ledge 184 of the adapter 144. A dark space shield 186 is supported on the flange 182 of the bottom shield 180, and fasteners (not shown), such as screws recessed in the upper surface of the dark space shield 186 fix it and the flange 182 to the adapter ledge 184 having tapped holes receiving the screws. This metallic threaded connection allows the two shields 180, 186 to be grounded to the adapter 144. The adapter 144 in turn is sealed and grounded to an aluminum chamber sidewall 150. Both shields 180, 186 are typically formed from hard, non-magnetic stainless steel.

The dark space shield 186 has an upper portion that closely fits an annular side recess of the target 142 with a narrow gap 188 between the dark space shield 186 and the target 142 which is sufficiently narrow to prevent the plasma from penetrating, hence protecting the dielectric isolator 146 from being sputter coated with a metal layer, which would electrically short the target 142. The dark space shield 186 also includes a downwardly projecting tip 190, which prevents the interface between the bottom shield 180 and dark space shield 186 from becoming bonded by sputter deposited metal.

Returning to the overall view of FIG. 3, the bottom shield 180 extends downwardly in an upper generally tubular portion 194 of a first diameter and a lower generally tubular portion 196 of a smaller second diameter to extend generally along the walls of the adapter 144 and the chamber wall 150 to below the top surface of the pedestal 152. It also has a bowl-shaped bottom including a radially extending bottom portion 198 and an upwardly extending inner portion 100 just outside of the pedestal 152. A cover ring 102 rests on the top of the upwardly extending inner portion 100 of the bottom shield 180 when the pedestal 152 is in its lower, loading position but rests on the outer periphery of the pedestal 152 when it is in its upper, deposition position to protect the pedestal 152 from sputter deposition. An additional deposition ring (not shown) may be used to shield the periphery of the substrate 154 from deposition.

The chamber 36 may also be adapted to provide a more directional sputtering of material onto a substrate. In one aspect, directional sputtering may be achieved by positioning a collimator 110 between the target 142 and the substrate support pedestal 152 to provide a more uniform and symmetrical flux of deposition material on the substrate 154.

Figure 5:
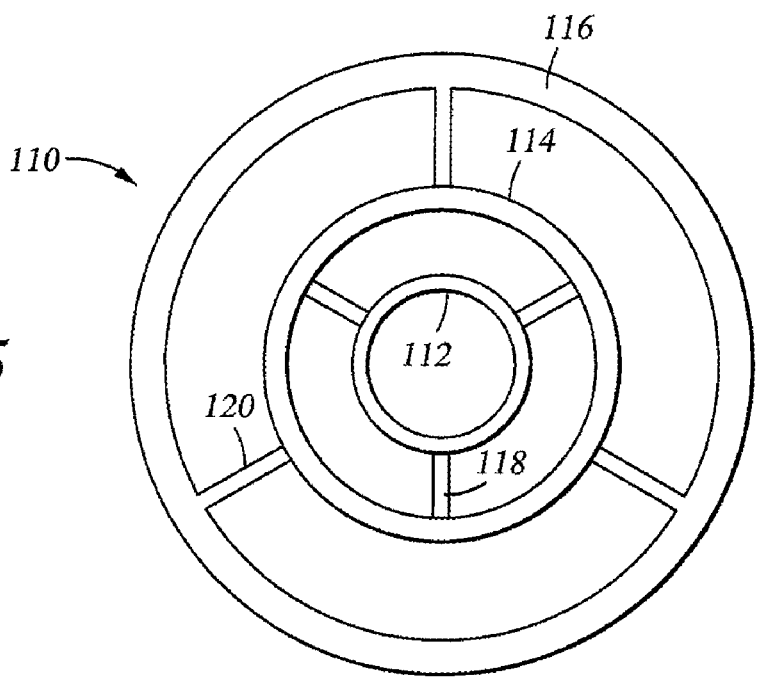
FIG. 5 is a plan view of one embodiment of a ring collimator.

A metallic ring collimator 110, such as the Grounded Ring collimator, rests on the ledge portion 106 of the bottom shield 180, thereby grounding the collimator 110. The ring collimator 110 includes an outer tubular section and at least one inner concentric tubular section, for example, three concentric tubular sections 112, 114, 116 linked by cross struts 118, 120 as shown in FIG. 5. The outer tubular section 116 rests on the ledge portion 106 of the bottom shield 180. The use of the bottom shield 180 to support the collimator 110 simplifies the design and maintenance of the chamber 36. At least the two inner tubular sections 112, 114 are of sufficient height to define high aspect-ratio apertures that partially collimate the sputtered particles. Further, the upper surface of the collimator 110 acts as a ground plane in opposition to the biased target 142, particularly keeping plasma electrons away from the substrate 154.

Figure 6:
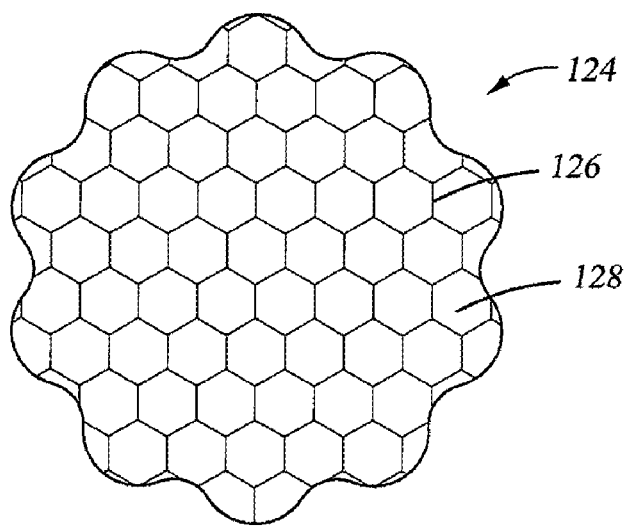
FIG. 6 is a partial plan view of one embodiment of a honeycomb collimator.

Another type of collimator usable with the invention is a honeycomb collimator 124, partially illustrated in the plan view of FIG. 6 having a mesh structure with hexagonal walls 126 separating hexagonal apertures 128 in a close-packed arrangement. An advantage of the honeycomb collimator 124 is, if desired, the thickness of the collimator 124 can be varied from the center to the periphery of the collimator 124, usually in a convex shape, so that the apertures 128 have aspect ratios that are likewise varying across the collimator 124. The collimator may have one or more convex sides. This allows the sputter flux density to be tailored across the substrate, permitting increased uniformity of deposition. Collimators that may be used in the PVD chamber are described in U.S. Pat. No. 5,650,052, issued Jul. 22, 1997, which is hereby incorporated by reference herein to the extent not inconsistent with aspects of the invention and claims described herein.

One embodiment of a substrate support pedestal 152 is shown in FIG. 7A. The substrate support pedestal 152 is suitable for use in a high temperature high vacuum annealing process. Generally, the substrate support pedestal 152 includes a heating portion 210 disposed on a base 240 coupled to a shaft 245.

The heating portion 210 generally includes heating elements 250 disposed in a thermally conducting material 220 and a substrate support surface 275. The thermally conducting material 220 may be any material that has sufficient thermal conductance at operating temperatures for efficient heat transfer between the heating elements 250 and a substrate support surface 275. An example of the conducting material is steel. The substrate support surface 275 may include a dielectric material and typically includes a substantially planar receiving surface for a substrate 154 disposed thereon.

The heating elements 250 may be resistive heating elements, such as electrically conducting wires having leads embedded within the conducting material 220, and are provided to complete an electrical circuit by which electricity is passed through the conducting material 220. An example of a heating element 250 includes a discrete heating coil disposed in the thermally conducting material 220. Electrical wires connect an electrical source 296, such as a voltage source, to the ends of the electrically resistive heating coil to provide energy sufficient to heat the coil. The coil may take any shape that covers the area of the substrate support pedestal 152. More than one coil may be used to provide additional heating capability, if needed.

Fluid channels 290 may be coupled to a surface 226 of the heating portion 210 and may provide for either heating or cooling of the substrate support pedestal 152. The fluid channels 290 may include a concentric ring or series of rings (not shown), or other desired configuration, having fluid inlets and outlets for circulating a liquid from a remotely located fluid source 294. The fluid channels 290 are connected to the fluid source 294 by fluid passage 292 formed in the shaft 245 of substrate support pedestal 152. Embodiments of the substrate support pedestal 152, including both heating elements 250 coupled to an electrical source 296 and fluid channels 290 cooled by a thermal medium passing through fluid passage 292 connected to the fluid source 294, i.e., a liquid heat exchanger, generally achieve temperature control of the surface 275 of the substrate support pedestal 152.

Temperature sensors 260, such as a thermocouple, may be attached to or embedded in the substrate support pedestal 152, such as adjacent the heating portion 210, to monitor temperature in a conventional manner. For example, measured temperature may be used in a feedback loop to control electric current applied to the heating elements 250 from the electrical source 296, such that substrate temperature can be maintained or controlled at a desired temperature or within a desired temperature range. A control unit (not shown) may be used to receive a signal from temperature sensors 260 and control the heat electrical source 296 or a fluid source 294 in response.

The electrical source 296 and the fluid source 294 of the heating and cooling components are generally located external of the chamber 36. The utility passages, including the fluid passage 292, are disposed axially along the base 240 and shaft 245 of the substrate support pedestal 152. A protective, flexible sheath 295 is disposed around the shaft 245 and extends from the substrate support pedestal 152 to the chamber wall (not shown) to prevent contamination between the substrate support pedestal 152 and the inside of the chamber 36.

The substrate support pedestal 152 may further contain gas channels (not shown) fluidly connecting with the substrate receiving surface 275 of the heating portion 210 to a source of backside gas (not shown). The gas channels define a backside gas passage of a heat transfer gas or masking gas between the heating portion 210 and the substrate 154.

Figure 7B:
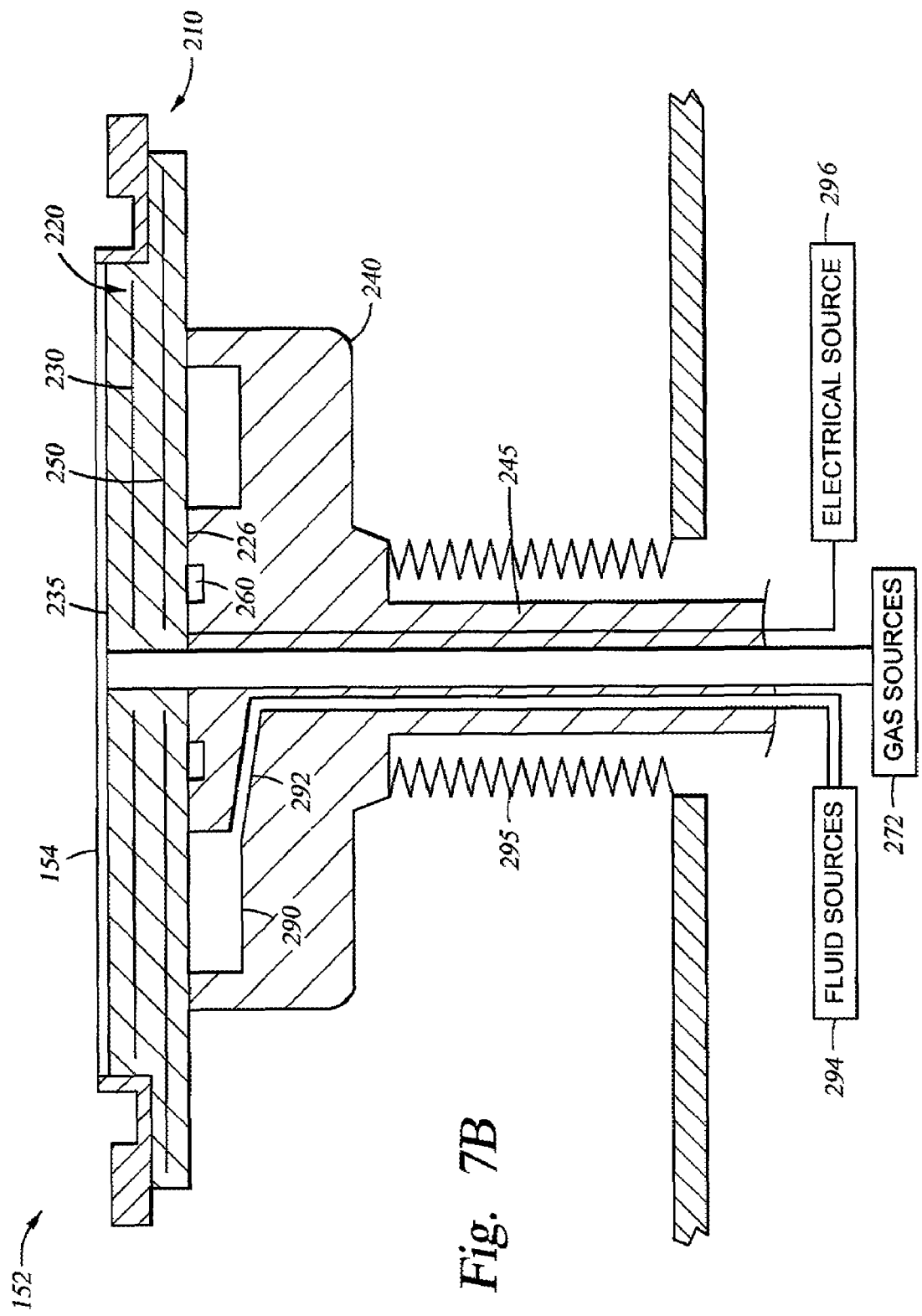
FIG. 7B is a cross-sectional view of another embodiment of a pedestal for annealing a substrate.

FIG. 7B illustrates another embodiment of the substrate support pedestal 152 having an electrostatic chuck mounted to or forming the heating portion 210 of the substrate support pedestal 152. The heating portion 210 includes an electrode 230 and a substrate receiving surface 275 coated with a dielectric material 235. Electrically conducting wires (not shown) couple the electrodes 230 to a voltage source (not shown). A substrate 154 may be placed in contact with the dielectric material 235, and a direct current voltage is placed on the electrode 230 to create an electrostatic attractive force to grip the substrate.

Generally, the electrodes 230 are disposed in the thermally conducting material 220 in a spaced relationship with the heating elements 250 disposed therein. The heating elements 250 are generally disposed in a vertically spaced and parallel manner from the electrodes 230 in the thermally conducting material 220. Typically, the electrodes 230 are disposed between the heating elements 250 and the substrate receiving surface 275 though other configurations may be used.

The embodiments of the substrate support pedestals 152 described above may be used to support a substrate in a high vacuum anneal chamber. The high vacuum anneal chamber may include substrate support pedestals 152 disposed in a PVD chamber, such as the long throw chamber 36 described herein, with a blank target disposed therein or without a target and without bias coupled to either the target or substrate support pedestal.

Embodiments of the substrate support pedestal 152 are described above and are provided for illustrative purposes and should not be construed or interpreted as limiting the scope of the invention. For example, suitable electrostatic chucks that may be used for the support pedestal include MCA™ Electrostatic E-chuck or Pyrolytic Boron Nitride Electrostatic E-Chuck, both available from Applied Materials, Inc., of Santa Clara, Calif.

While the embodiments of substrate support pedestal 152 described herein may be used to anneal the substrate, commercially available anneal chambers, such as rapid thermal anneal (RTA) chambers may also be used to anneal the substrate to form the silicide films. The invention contemplates utilizing a variety of thermal anneal chamber designs, including hot plate designs and heated lamp designs, to enhance the electroplating results. One particular thermal anneal chamber useful for the present invention is the WXZ™ chamber available from Applied Materials, Inc., located in Santa Clara, Calif. One particular hot plate thermal anneal chamber useful for the present invention is the RTP XEplus CENTURA® thermal processing chamber available from Applied Materials, Inc., located in Santa Clara, Calif. One particular lamp anneal chamber is the RADIANCE® thermal processing chamber available from Applied Materials, Inc., located in Santa Clara, Calif.

Referring to FIGS. 1 and 2, the processing chambers 36, 38, 40, 42, and 43, are each controlled by a microprocessor controller 54. The microprocessor controller 54 may be one of any form of general purpose computer processor (CPU) that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Software routines as required may be stored in the memory or executed by a second CPU that is remotely located.

The process sequence routines are executed after the substrate 154 is positioned on the pedestal 152. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

In operation, the substrate 154 is positioned on the substrate support pedestal 152 and plasma is generated in the chamber 36. A long throw distance of at least about 90 mm separates the target 142 and the substrate 154. The substrate support pedestal 152 and the target 142 may be separated by a distance between about 100 mm and about 300 mm for a 200 mm substrate. The substrate support pedestal 152 and the target 142 may be separated by a distance between about 150 mm and about 400 mm for a 300 mm substrate. Any separation between the substrate 154 and target 142 that is greater than 50% of the substrate diameter is considered a long throw processing chamber.

The sputtering process is performed by applying a negative voltage, typically between about 0 V and about 2,400 V, to the target 142 to excite the gas into a plasma state. The D.C. power supply 148 or another power supply may be used to apply a negative bias, for example, between about 0 V and about 700 V, to the substrate support pedestal 152. Ions from the plasma bombard the target 142 to sputter atoms and larger particles onto the substrate 154 disposed below. While the power supplied is expressed in voltage, power may also be expressed as kilowatts or a power density (w/cm$^2$). The amount of power supplied to the chamber 36 may be varied depending upon the amount of sputtering and the size of the substrate 154 being processed.

Processing gas used for the sputtering process is introduced into the processing chamber 36 via the mass flow controller 164. The processing gas includes non-reactive or inert species such as argon (Ar), xenon (Xe), helium (He), or combinations thereof. A vacuum pumping system 166 connected through a pumping port 168 is used to maintain the chamber 36 at a base pressure of less than about $1\times10^{-6}$ Torr, such as about $1\times10^{-8}$ Torr, but the processing pressure within the chamber 36 is typically maintained at between 0.2 milliTorr and 2 milliTorr, preferably less than 1 milliTorr, for cobalt sputtering.

In operation, a substrate 154 is disposed on the substrate support pedestal 152, and the substrate 154 is heated, with or without the presence of a backside gas source 272, by the heating elements 250 to the desired processing temperature, processed for sufficient time to anneal the substrate 154 for the desired anneal results, and then removed from the chamber 36. The heating elements 250 of the substrate support pedestal 152 can heat the substrate 154 from room temperature, i.e., about 20° C. to about 900° C. and the fluid channels 290 may cool the substrate 154 to a temperature of about 0° C. The combination of heating elements 250 and the fluid channels 290 are generally used to control the temperature of a substrate 154 between about 10° C. and about 900° C., subject to properties of materials used in substrate support pedestal 152 and the process parameters used for processing a substrate in the chamber 36.

Metal and Metal Silicide Barrier Deposition Processes

Embodiments of the processes described herein relate to depositing metal and metal silicide barrier layers for feature definitions. In one aspect, a first metal layer is deposited on a silicon-containing material and annealed to form a metal silicide layer. A second metal layer is then deposited on the metal silicide layer to fill the feature. The annealing process for forming the metal silicide layer may be performed in multiple annealing steps. The deposition of the first metal layer, the second metal layer, and any required annealing step(s) are preferably performed without breaking vacuum in one vacuum processing system.

The two step annealing process is used to convert the metal layer to a first phase of metal silicide, such as converting cobalt and silicon to a first cobalt silicide (CoSi) phase, or partially convert the metal to a metal silicide. In the second annealing step, the metal is substantially converted to the desired silicide phase, such as converting the first cobalt silicide (CoSi) phase to a cobalt silicide (CoSi$_2$) product with desired barrier layer properties. Metal silicide is broadly defined herein as an alloy of metal and silicon, which may exist in multiple phases.

The first annealing step may be performed in the same chamber as the deposition of the first metal, an annealing chamber, such as a vacuum annealing chamber, or during deposition of subsequent materials, such as during a chemical vapor deposition of the second metal. The second annealing step may be performed before or after the deposition of the second metal. The second annealing process generally has a higher annealing temperature than the first annealing process.

Preferably, the metal silicide layer may be formed in situ, such as in a deposition chamber or in a processing system without breaking vacuum, prior to or concurrently with depositing a metal layer by a chemical vapor deposition technique. In situ is broadly defined herein as performing two or more processes in the same chamber or in the same processing system without breaking vacuum or transfer to a separate apparatus or system.

For example, in situ annealing may be performed in the same processing chamber as the metal deposition and in situ deposition may performed in a processing chamber adjacent to the deposition chamber, both of which are coupled to a transfer chamber, and the vacuum on the transfer chamber is not broken during processing.

In a further example, in situ processing may be performed on the same processing system at separate processing pressures, such as processing a substrate in processing chambers and annealing chambers disposed on the first and second transfer chambers 48, 50, respectfully, in system 35 without breaking the vacuum on the system 35 or transfer of the substrate to another processing system.

While the following material describes the formation of a metal silicide layer from a cobalt or nickel layer film, the invention contemplates the use of other materials, including titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Reactive Pre-Clean

Prior to metal deposition on a substrate, the surface of the substrate 154 may be cleaned to remove contaminants, such as oxides formed on exposed. The cleaning process may be performed by a wet etch process, such as exposure to a hydrofluoric acid solution, or by a plasma cleaning process, such as exposure to a plasma of an inert gas, a reducing gas, such as hydrogen or ammonia, or combinations thereof. The cleaning process may also be performed between processing steps to minimize contamination of the substrate surface during processing.

The plasma clean process may be performed in the Pre-Clean II processing chamber and the RPC+ processing chamber described herein, of which both are commercially available form Applied Materials, Inc., of Santa Clara, Calif. In one aspect, the reactive pre-clean process forms radicals from a plasma of one or more gases such as argon, helium, hydrogen, nitrogen, fluorine-containing compounds, and combinations thereof. For example, a pre-clean gas may include a mixture of carbon tetrafluoride ($CF_4$) and oxygen ($O_2$), or a mixture of helium (He) and nitrogen trifluoride ($NF_3$). Preferably, the pre-clean gas is a mixture of helium and nitrogen trifluoride.

The plasma is typically generated by applying a power between about 500 and about 2,000 watts RF at a frequency between about 200 KHz and about 114 MHz. The flow of helium ranges between about 100 and about 500 sccm and the flow of nitrogen trifluoride typically ranges between about 100 sccm and about 500 sccm for 200 mm substrates. The plasma treatment lasts between about 10 and about 150 seconds. Preferably, the plasma is generated in one or more treatment cycles and purged between cycles. For example, four treatment cycles lasting 35 seconds each is effective.

In another aspect, the substrate 154 may be pre-cleaned using an argon plasma first and then a hydrogen plasma. A first pre-clean gas comprising greater than about 50% argon by number of atoms is introduced at a pressure of about 0.8 milliTorr. A plasma of the argon gas is struck to subject the substrate 154 to an argon sputter cleaning environment. The argon plasma is preferably generated by applying between about 50 watts and about 500 watts of RF power. The argon plasma is maintained for between about 10 seconds and about 300 seconds to provide sufficient cleaning time for the deposits that are not readily removed by a reactive hydrogen plasma.

Following the argon plasma, the chamber pressure is increased to about 140 milliTorr, and a second pre-clean gas consisting essentially of hydrogen and helium is introduced into the processing region. Preferably, the processing gas comprises about 5% hydrogen and about 95% helium. The hydrogen plasma is generated by applying between about 50 watts and about 500 watts power. The hydrogen plasma is maintained for about 10 seconds to about 300 seconds.

Metal Deposition

A first metal layer may be deposited on a substrate 154 disposed in chamber 36 as a barrier layer for a second metal layer "plug" or may be deposited and annealed on the substrate pedestal 152 to form the metal silicide layer without breaking vacuum. The substrate 154 includes dielectric materials, such as silicon or silicon oxide materials, disposed thereon and is generally patterned to define features into which metal films may be deposited or metal silicide films will be formed. The first metal layer may be deposited by a physical vapor deposition technique, a chemical vapor deposition technique, or an atomic layer deposition technique.

In a physical vapor deposition technique, the metal is deposited using the PVD chamber 36 described above. The target 142 of material, such as cobalt, to be deposited is disposed in the upper portion of the chamber 36. A substrate 154 is provided to the chamber 36 and disposed on the substrate support pedestal 152. A processing gas is introduced into the chamber 36 at a flow rate of between about 5 sccm and about 30 sccm. The chamber pressure is maintained below about 5 milliTorr to promote deposition of conformal PVD metal layers. Preferably, a chamber pressure between about 0.2 milliTorr and about 2 milliTorr may be used during deposition. More preferably, a chamber pressure between about 0.2 milliTorr and about 1.0 milliTorr has been observed to be sufficient for sputtering cobalt onto a substrate.

Plasma is generated by applying a negative voltage to the target 142 between about 0 volts (V) and about −2,400 V. For example, negative voltage is applied to the target 142 at between about 0 V and about −1,000 V to sputter material on a 200 mm substrate. A negative voltage between about 0 V and about −700 V may be applied to the substrate support pedestal 152 to improve directionality of the sputtered material to the substrate surface. The substrate 154 is maintained at a temperature between about 10° C. and about 600° C. during the deposition process.

An example of a deposition process includes introducing an inert gas, such as argon, into the chamber 36 at a flow rate between about 5 sccm and about 30 sccm, maintaining a chamber pressure between about 0.2 milliTorr and about 1.0 milliTorr, applying a negative bias of between about 0 volts and about 1,000 volts to the target 142 to excite the gas into a plasma state, maintaining the substrate 154 at a temperature between about 10° C. and about 600° C., preferably about 50° C. and about 300° C., and more preferably, between about 50° C. and about 100° C. during the sputtering process, and spacing the target 142 between about 100 mm and about 300 mm from the substrate surface for a 200 mm substrate. Cobalt may be deposited on the silicon material at a rate between about 300 Å/min and about 2,000 Å/min using this process. A collimator 110 or 124 may be used with the process described herein with minimal detrimental affect on deposition rate.

While not shown, the barrier material, such as cobalt or nickel described above, may be deposited by another method using the apparatus shown in FIGS. 1 and 2. The cobalt material may be deposited by a chemical vapor deposition (CVD) technique, an atomic layer deposition (ALD) technique, an ionized magnetic plasma PVD (IMP-PVD) technique, a self-ionized plasma PVD (SIP-PVD) technique or combinations thereof. For example, the cobalt material may be deposited by CVD in a CVD chamber, such as chamber 38 of the processing platform 35 as shown in FIG. 1, or by ALD in an ALD chamber or CVD chamber disposed at position 38, as shown in FIG. 1.

Alternatively, prior to second metal deposition, such as tungsten, a layer of a barrier material, such as titanium or titanium nitride, may be deposited on the first metal layer. The layer of barrier material improves resistance to interlayer diffusion of the second metal layer into the underlying substrate or silicon material. Additionally, the layer of barrier material may improve interlayer adhesion between the first and second metal layers. Suitable barrier layer materials include titanium, titanium nitride, tantalum, tantalum nitride, tungsten nitride, titanium-tungsten alloy, and combinations thereof. The layer of barrier materials may be deposited by a chemical vapor deposition (CVD) technique, an atomic layer deposition (ALD) technique, an ionized magnetic plasma PVD (IMP-PVD) technique, a self-ionized plasma PVD (SIP-PVD) technique, or combinations thereof.

Tungsten Deposition

In one aspect, the substrate is then transferred to a chemical vapor deposition chamber for the deposition of a second metal layer, such as tungsten, on the first metal layer, such as cobalt or nickel. Tungsten may be deposited by a chemical vapor deposition (CVD) technique. Tungsten may be deposited at a sufficient temperature, such as between about 300° C. and about 500° C., to initiate the formation of a metal silicide, such as cobalt silicide. The metal silicide may be formed from part or all of the first metal layer.

An annealing step may be performed in the processing chamber, such as the WXZ™, prior to material deposition. Such an annealing step is performed at a temperature between about 300° C. and about 900° C., such as between about 300° C. and about 400° C. A thin layer of silicon, or "silicon soak" may be deposited on the barrier layer prior to deposition of any tungsten material. The silicon deposition may be performed in situ with the same chemical vapor deposition chamber as the tungsten material deposition. Additionally, a tungsten nucleation step may be performed prior to a main tungsten deposition. The tungsten nucleation step may be performed in situ by an atomic layer deposition (ALD) technique or CVD process in the same chemical vapor deposition chamber as the main tungsten deposition or subsequent tungsten deposition.

An example of a tungsten chemical vapor deposition process includes depositing a silicon layer, also known as a silicon soak layer, a tungsten nucleation layer deposition, and a main, or bulk, tungsten deposition. The silicon layer is deposited by introducing a silane gas (or silane gas derivative) into the chamber 36 at a flow rate between about 50 sccm and about 100 sccm, a reactive gas, such as hydrogen ($H_2$), into the chamber at a flow rate between about 500 sccm and about 5,000 sccm, and an inert gas, such as argon or nitrogen, into the chamber 36 at a flow rate between about 500 sccm and about 5,000 sccm, maintaining the chamber pressure between about 100 milliTorr and about 300 Torr, and maintaining the substrate temperature between about 300° C. and about 500° C. The process may be performed for between about 5 seconds and about 30 seconds. The silicon layer is usually deposited at a thickness of about 1,000 Å or less.

The tungsten nucleation layer is deposited by a process including introducing a tungsten precursor gas, such as tungsten hexafluoride ($WF_6$) or derivative thereof, into the chamber 36 at a flow rate between about 5 sccm and about 60 sccm, a silane gas, $SiH_4$, or derivative thereof, into the chamber 36 at a flow rate between about 5 sccm and about 60 sccm, a reactive gas, such as hydrogen ($H_2$), into the chamber at a flow rate between about 500 sccm and about 5,000 sccm, and an inert gas, such as argon or nitrogen, into the chamber 36 at a flow rate between about 500 sccm and about 5,000 sccm, and maintaining a chamber pressure between about 100 milliTorr and about 300 Torr, and maintaining the substrate temperature between about 300° C. and about 500° C. The process may be performed for between about 5 seconds and about 30 seconds. The nucleation layer is usually deposited at a thickness of about 1,000 Å or less.

The tungsten layer is then deposited on the tungsten nucleation layer by a process including introducing a tungsten precursor gas, such as tungsten hexafluoride ($WF_6$) or derivative thereof, into the chamber 36 at a flow rate between about 25 sccm and about 250 sccm, a reactive gas, such as hydrogen ($H_2$), into the chamber 36 at a flow rate between about 500 sccm and about 5,000 sccm, and an inert gas, such as argon or nitrogen, into the chamber 36 at a flow rate between about 500 sccm and about 5,000 sccm, and maintaining a chamber pressure between about 100 milliTorr and about 300 Torr, and maintaining the substrate temperature between about 300° C. and about 900° C. The process may be performed for between about 5 seconds and about 300 seconds or until a desired thickness is reached. The deposition rate for tungsten is between about 1,000 Å/min and about 3,000 Å/min.

The substrate temperature during the main tungsten deposition process is maintained at sufficient temperature to initiate the formation of a metal silicide layer from silicon material on the substrate 154 and the first metal layer disposed thereon. For example, a substrate temperature between about 300° C. and about 900° C., such as between about 300° C. and about 400° C., may be maintained to form the silicide layer with diffusion barrier properties simultaneously with tungsten deposition.

An example of the tungsten deposition process includes a silicon soak layer formed by introducing a silane gas at a flow rate of about 75 sccm, introducing hydrogen ($H_2$) at a flow rate of about 1,000 sccm, introducing argon or nitrogen at a flow rate of about 1,500 sccm, maintaining the chamber pressure at about 90 Torr, and maintaining the substrate temperature at about 425° C. The process may be performed for between about 10 seconds and about 20 seconds. The nucleation layer is deposited by introducing tungsten hexafluoride ($WF_6$) at a flow rate of about 20 sccm, silane gas at a flow of about 10 sccm, hydrogen gas at a flow rate of about 3,000 sccm, and argon at a flow rate of about 3,000 sccm, and maintaining a chamber pressure at about 30 Torr, and maintaining the substrate temperature at about 425° C. This process may be performed for about 15 seconds. The tungsten layer is deposited by introducing tungsten hexafluoride ($WF_6$) at a flow rate of about 250 sccm, hydrogen gas at a flow rate of about 1,000 sccm, and argon at a flow rate of about 3,000 sccm, and maintaining a chamber pressure at about 300 Torr, and maintaining the substrate temperature at about 425° C. This process may be performed for between about 40 seconds and about 45 seconds.

General In-Situ Annealing Process

Alternatively, the first metal layer may be annealed in situ by one or more annealing steps at an annealing temperature between about 300° C. and about 900° C. to form the metal silicide layer prior to the deposition of the second metal layer. The one or more annealing steps may be performed for between about 10 seconds and about 600 seconds. A selective etch of the first metal layer and metal silicide layer to remove unreacted first metal material may be performed between two or more annealing steps. Deposition of materials, such as a layer of barrier material or the second metal layer, may be performed between two or more annealing steps.

In one example of the annealing process, the substrate 154 may be annealed under an inert gas environment in the deposition chamber 36 by first introducing an inert gas into the chamber at a flow rate between about 0 sccm (i.e., no backside gas) and about 15 sccm, maintaining a chamber pressure of about 2 milliTorr or less, and heating the substrate 154 to a temperature between about 300° C. and about 900° C. for between about 5 seconds and about 600 seconds to form the metal silicide layer.

Low Temperature Deposition and Two-Step In-Situ Annealing Process in Two Chambers In another embodiment, the metal layer may be physical vapor deposited on a silicon substrate in chamber 36, annealed at a first temperature for a first period of time, transferred to a second chamber, for example chamber 41, in the system 35, and annealed at a second temperature for a second period of time to form the metal silicide layer without breaking vacuum.

The physical vapor deposition of the metal is performed as described above at a temperature of about 200° C. or less, preferably between about 0° C. and about 100° C. The first step of the two step in situ annealing process described above may be performed under an inert gas environment in the deposition chamber by first introducing an inert gas into the chamber at a flow rate between about 0 sccm and about 15 sccm or less, maintaining a chamber pressure of about 2 milliTorr or less, heating the substrate 154 to a temperature between about 400° C. and about 600° C. for between about 5 seconds and about 300 seconds. Preferably, the substrate 154 is annealed in the deposition chamber at about 500° C. for between about 60 seconds and about 120 seconds. Performing the first annealing of the substrate 154 in the same chamber as the deposition process is preferred over other annealing processes described herein.

The substrate 154 is then removed from the deposition chamber and transferred to a vacuum anneal chamber disposed on the same transfer chamber, such as transfer chamber 48 described above in FIG. 1. The high vacuum anneal chamber may include a PVD chamber having a blank target and substrate support pedestal 152 described above or a commercial high vacuum anneal pedestal, such as the High Temperature High Uniformity (HTHU) substrate support, commercially available from Applied Materials, Inc., of Santa Clara, Calif.

The second annealing step may then be performed by maintaining a chamber pressure of about 2 milliTorr or less and heating the substrate 154 to a temperature between about 600° C. and about 900° C. for a period of time between about 5 seconds and about 300 seconds to form the metal silicide layer. Preferably, the substrate is annealed in the anneal chamber at 800° C. for between about 60 seconds and 120 seconds.

Low Temperature Deposition and Two-Step Anneal Process in Two Chambers

In an alternative embodiment of the two chamber deposition and anneal process, the metal layer is deposited according to the process described herein at about 200° C. or less, preferably between about 0° C. and about 100° C., in the deposition chamber. The substrate 154 is then annealed in the deposition chamber according to the anneal process described above. The substrate 154 may then be transferred to an RTA chamber disposed on transfer chamber 50 in FIG. 1 for a second anneal process.

Annealing in an RTA chamber may be performed by introducing a process gas including nitrogen ($N_2$), argon (Ar), helium (He), and combinations thereof, with less than about 4% hydrogen ($H_2$), at a process gas flow rate greater than 20 liters/min to control the oxygen content to less than 100 ppm, maintaining a chamber pressure of about ambient, and heating the substrate 154 to a temperature between about 600° C. and about 900° C. for between about 5 seconds and about 300 seconds to form the metal silicide layer. Preferably, the substrate 154 is annealed in the RTA chamber at 800° C. for about 30 seconds.

Low Temperature Deposition and Two-Step Annealing Process in Three Chambers

In another embodiment, the metal layer may be deposited on a silicon substrate in chamber 36, transferred to a first anneal chamber, such as a vacuum anneal chamber disposed on the same transfer chamber 48 on the system 35, annealed at first temperature for a first period of time, transferred to a second anneal chamber, for example chamber 41, in the system 35, and annealed at a second temperature for a second period of time to form the metal silicide layer without breaking vacuum.

The metal deposition is performed in the deposition chamber according to the process described above at a substrate temperature of about 200° C. or less, preferably between about 0° C. and about 100° C. The first step of this embodiment of the annealing process may be performed in situ in a first high vacuum anneal chamber disposed on a processing system by introducing an inert gas into the anneal chamber at a flow rate of 0 sccm and about 15 sccm, maintaining a chamber pressure about 2 milliTorr or less, heating the substrate 154 to a temperature between about 400° C. and about 600° C. for between about 5 seconds and about 300 seconds.

Preferably, the substrate 154 is annealed in the deposition chamber at about 500° C. for between about 60 seconds and about 120 seconds. The first annealing step is believed to form an oxygen resistant film such as CoSi.

The substrate 154 may be annealed in situ by transfer to a second high vacuum annealing chamber in the processing system 35. The second annealing step may then be performed by maintaining a chamber pressure of about 2 milliTorr or less and heating the substrate to a temperature between about 600° C. and about 900° C. for a period of time between about 5 seconds and about 300 seconds to form the metal silicide layer. Preferably, the substrate 154 is annealed in the anneal chamber at 800° C. for between about 60 seconds and 120 seconds.

Alternatively, the substrate 154 may be transferred to a second annealing chamber located outside the transfer chamber 48, 50 or processing system 35, such as an atmospheric pressure RTA chamber. Annealing in an atmospheric pressure RTA chamber may be performed by introducing a process gas including nitrogen ($N_2$), argon (Ar), helium (He), and combinations thereof, with less than about 4% hydrogen ($H_2$), at a process gas flow rate greater than 20 liters/min to control the oxygen content to less than 100 ppm, maintaining a chamber pressure of about ambient, and heating the substrate 154 to a temperature between about 400° C. and about 900° C. for between about 5 seconds and about 300 seconds to form the metal silicide layer. Preferably, the substrate 154 is annealed in the RTA chamber at 800° C. for about 30 seconds.

High Temperature Deposition and Annealing Process

The metal may be deposited at a high deposition temperature. An example of a deposition process includes introducing an inert gas, such as argon, into the chamber 36 at a flow rate between about 5 sccm and about 30 sccm, maintaining a chamber pressure between about 0.2 milliTorr and about 1.0 milliTorr, applying a negative bias of between about 0 volts and about 1,000 volts to the target 142 to excite the gas into a plasma state, maintaining the substrate 154 at an annealing temperature, i.e., between about 400° C. and about 600° C., by applying a backside gas, and spacing the target 142 between about 100 mm and about 300 mm from the substrate surface for a 200 mm substrate. The temperature may be maintained at about 200° C. by heating the substrate in the absence of a backside gas. Cobalt may be deposited on the silicon material at a rate between about 100 Å/min and about 2,000 Å/min using this process.

The annealing process can then be performed in the deposition chamber by ending the plasma and heating of the substrate 154 to a temperature between about 400° C. and 600° C. at the same heating levels used for the deposition process. The annealing process is performed at a temperature between about 400° C. and about 600° C. for between about 5 seconds and about 300 seconds. Preferably, the substrate 154 is annealed in the deposition chamber at about 500° C. for between about 60 seconds and about 120 seconds.

The second annealing step may then be formed in an annealing chamber without breaking vacuum or in an annealing chamber located on a separate transfer chamber or processing system. The second annealing step includes heating the substrate 154 to a temperature between about 600° C. and about 900° C. for a period of time between about 5 seconds and about 300 seconds to form the metal silicide layer. Preferably, the substrate 154 is annealed at 800° C. for between about 60 seconds and 120 seconds.

Interlayer Deposition and Annealing process

In one aspect of the invention, the two-step annealing process described herein may be separated by one or more processing steps, such as deposition processes. For example, a first metal layer, such as a cobalt or nickel layer, may be deposited in a first chamber, in situ annealed in the first transfer chamber or transferred to a second chamber for subsequent deposition and annealed therein. A second metal layer, such as tungsten, is then deposited on the annealed substrate 154, and the substrate 154 is exposed to a second anneal in the second chamber or transferred to a third chamber for the completion of the annealing process.

In another example, a first metal layer, such as a cobalt or nickel layer may be deposited in a first chamber, in situ annealed in the processing platform 35, transferred to a second deposition chamber for deposition of a barrier material thereon, such as titanium nitride, transferred to a third deposition chamber for deposition of a second metal, and then further annealed in the third chamber or transferred to a fourth chamber for the completion of the annealing process. Alternatively, the in situ anneal of the first metal layer may be performed after the deposition of the barrier material and prior to the deposition of the second metal layer, such as tungsten.

Examples of Metal and Metal Silicide Deposition

Figure 8A:
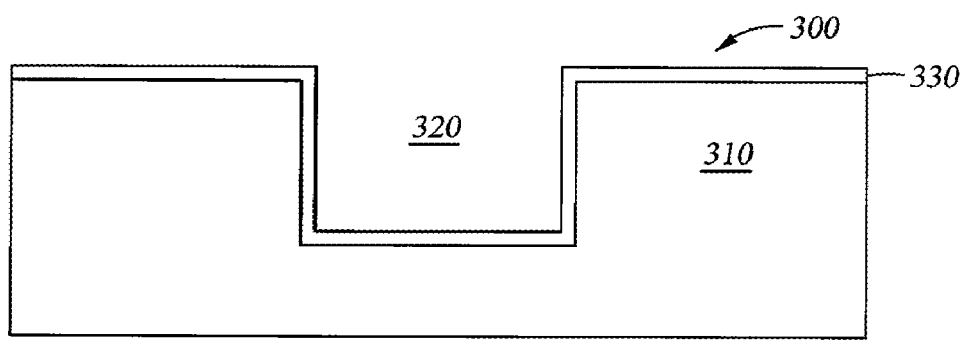
FIGS. 8A-8C are schematic sectional views of one deposition process described herein.
Figure 8B:
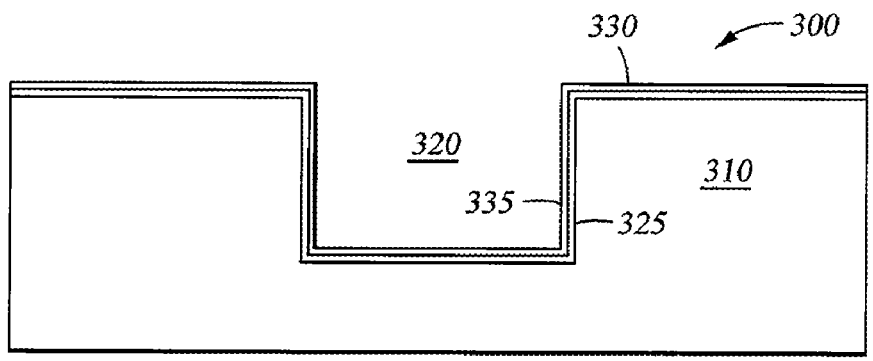

An example of a deposition process of a metal silicide layer as a barrier layer for a tungsten plug in a feature definition is as follows and shown in FIGS. 8A-8C. A substrate 300 having a silicon-containing material 310 formed thereon with feature definitions 320 formed therein is provided to the processing system 35. The silicon-containing material 310 may be a dielectric material including silicon, silicon oxide, a doped silicon or silicon oxide layer, or other silicon-containing dielectric material used in substrate processing, which may be deposited by physical vapor deposition, chemical vapor deposition, or other method known or unknown in the art. The invention also contemplates that layer 310 may include semiconductive silicon-containing materials including polysilicon, doped polysilicon, or combinations thereof, deposited by methods known or unknown in the art.

Feature definitions 320 are formed in the silicon-containing material 310 by conventional methods known in the art. For example, the feature definitions 320 may be formed by depositing and patterning a photoresist material to define the feature openings, a silicon etch process is then used to define the feature definitions 320, and any remaining photoresist material is removed, such as by an oxygen stripping method. The feature definitions 320 may then be treated with a plasma clean process to remove any contaminants, such as oxide formed on the silicon-containing material, prior to deposition of subsequent materials as described herein. A layer of cobalt is deposited as a barrier layer 330 by the PVD process described herein over the bottom and sidewalls of the feature definitions 320 as shown in FIG. 8A.

The cobalt barrier layer 330 may be annealed to form cobalt silicide at the interface 325 of the cobalt layer and the silicon containing material 310. Depending on the annealing process used, substantially all or only a portion of the cobalt layer 330 may be converted to cobalt silicide. When the cobalt material is not substantially converted to the cobalt silicide material, a surface 335 of unreacted cobalt is formed which is exposed to subsequently deposited materials as shown in FIG. 8B. This cobalt surface 335 may be maintained to further act as additional barrier layer material for subsequent metal deposition, such as tungsten, or may be removed from the substrate 300 surface by an etch process.

Figure 8C:
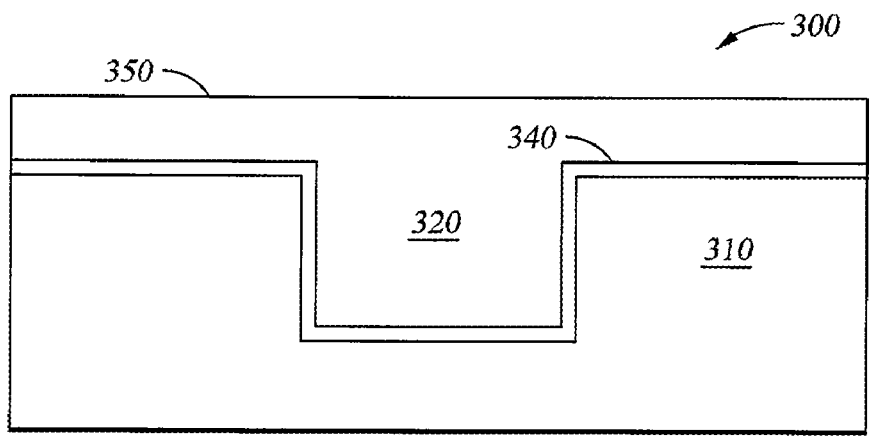

A layer of tungsten 350 is deposited to fill the feature definition 320 as shown in FIG. 8C. The tungsten deposition may be at a high enough temperature to completely convert any unreacted cobalt material to cobalt silicide, in effect annealing the cobalt material, while depositing to fill the feature definition 320. Alternatively, a second annealing step is performed to substantially convert the cobalt layer 330 to a cobalt silicide layer 340.

Such a cobalt silicide barrier and tungsten fill of the feature definition 320 may be processed in the system 35 as follows. Referring to FIG. 2, the substrate 300 is introduced into the first transfer chamber 48 of the system 35 via the loadlock 46. The first transfer chamber 48 is operating at about 400 milliTorr. Transfer robot 49 retrieves the substrate 300 from the loadlock 46 and transfers it to pass-through chamber 52. Transfer robot 51 in the second transfer chamber 50 retrieves the substrate 300 from the pass-through chamber 52 and positions the substrate 300 in PVD chamber 38 for cobalt deposition. The second transfer chamber 50 is operated at about $1 \times 10^{-8}$ Torr. Alternatively, the transfer robot 51 positions the substrate 300 in one of the pre-clean chambers prior to cobalt deposition in the PVD chamber 38. Following PVD deposition, the substrate 300 is transferred back to the first transfer chamber 48 and disposed in a WXZ™ CVD chamber 38 for CVD tungsten deposition. The substrate may then be annealed as necessary.

Alternatively, following PVD deposition, the substrate 300 is disposed in chamber 41, which is a WXZ™ chamber capable of in situ annealing, where the cobalt material is first annealed to form a silicide material or to improve barrier properties prior to CVD deposition. A layer of tungsten may then be deposited in the WXZ™ chamber following the anneal step. However, the substrate 300 may be transferred after the first anneal in the WXZ™ chamber to a plasma etch chamber, such as a DPS® chamber, for etching to remove cobalt and then annealed a second time in the WXZ™ chamber or another anneal chamber prior to tungsten deposition. Following deposition, and annealing if necessary, the substrate 300 is transferred to the loadlock chamber 46 via the transfer robot 49. The substrate 300 may then be transferred to a separate apparatus, such as a chemical-mechanical polishing apparatus, for further processing.

Figure 9:
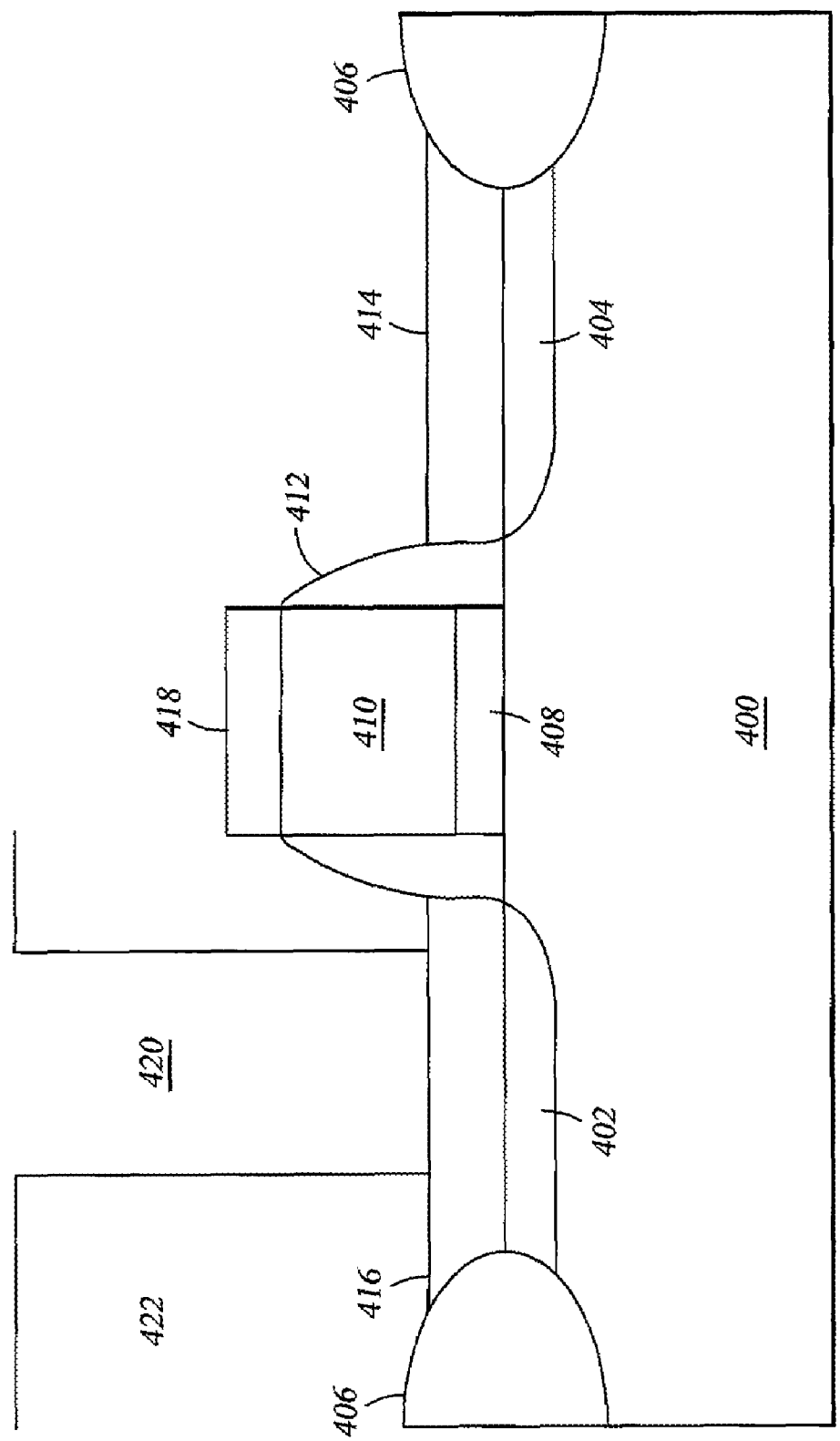
FIG. 9 is a simplified sectional view of a silicide material used as a contact with a transistor.

Another metal silicide application includes the formation of a MOS device shown in FIG. 9. The metal silicide includes silicides of cobalt, titanium, tantalum, tungsten, molybdenum, platinum, nickel, iron, niobium, palladium, and combinations thereof, for use in an MOS device.

In the illustrated MOS structure, N+ source and drain regions 402 and 404 are formed in a P type silicon substrate 400 adjacent field oxide portions 406. A gate oxide layer 408 and a polysilicon gate electrode 410 are formed over silicon substrate 400 in between source and drain regions 402 and 404 with oxide spacers 412 formed on the sidewalls of polysilicon gate electrode 410.

A cobalt layer is deposited over the MOS structure, and in particular over the exposed silicon surfaces of source and drain regions 402 and 404 and the exposed top surface of polysilicon gate electrode 410 by the process described herein. The cobalt material is deposited to a thickness of at about 1,000 Å or less to provide a sufficient amount of cobalt for the subsequent reaction with the underlying silicon at drain regions 402 and 404. Cobalt may be deposited to a thickness between about 50 Å and about 500 Å on the silicon material. In one aspect, the cobalt layer is then annealed in situ as described herein to form cobalt silicide.

While not shown, a barrier or liner layer of a material, such as titanium nitride, may be deposited on the cobalt material to further enhance the barrier properties of the cobalt layer. The deposition of the titanium nitride layer may replace the step of removing unreacted cobalt as described above. However, the unreacted cobalt and titanium may be removed by the etch process after annealing of the substrate surface according to the anneal processes described herein.

The substrate 400 may then be annealed again according to one of the two-step annealing processes described herein. Dielectric materials 422 may be deposited over the formed structure and etched to provide contact definitions 420 in the device. The contact definitions 420 may then be filled with a contact material, such as tungsten, aluminum, or copper, from chemical vapor deposition techniques, such as described herein.

In one aspect, any unreacted cobalt from the annealing processes may be removed from the substrate surface, typically by a wet etch process or plasma etch process, and the cobalt silicide remains as cobalt silicide ($CoSi_2$) portions 414, 416, and 418 of uniform thickness respectively formed over polysilicon gate electrode 410 and over source and drain regions 402 and 404 in silicon substrate 400. Unreacted cobalt may be removed by a plasma process in a DPS® chamber located on the same vacuum processing system, or may be transferred to another processing system for processing. Wet etch process are typically performed in a second processing system.

While the foregoing is directed to embodiments of the present invention, other and further embodiments of the invention may be devised without departing from the basic scope thereof, and the scope thereof is determined by the claims that follow.

The invention claimed is:

1. A method for depositing materials on a substrate, comprising:
   forming a barrier layer on a substrate;
   exposing the substrate to a silane gas to form a thin silicon-containing layer on the barrier layer during a soak process;
   depositing a tungsten nucleation layer over the barrier layer and the thin silicon-containing layer during an atomic layer deposition process; and
   depositing a tungsten bulk layer on the tungsten nucleation layer during a chemical vapor deposition process.

2. The method of claim 1, wherein the barrier layer comprises a metallic cobalt layer and a cobalt silicide layer.

3. The method of claim 2, wherein the barrier layer is formed by:
   depositing a cobalt-containing material on a dielectric surface of the substrate; and
   annealing the substrate to form the cobalt silicide layer from a lower portion of the cobalt-containing material and the metallic cobalt layer from an upper portion of the cobalt-containing material.

4. The method of claim 3, wherein the cobalt-containing material is deposited by an atomic layer deposition process.

5. The method of claim 3, wherein the cobalt-containing material is deposited by a physical vapor deposition process.

6. The method of claim 3, wherein the cobalt-containing material is deposited by a chemical vapor deposition process.

7. The method of claim 1, wherein the barrier layer is formed by depositing a cobalt-containing material or a nickel-containing material on the substrate by an atomic layer deposition process.

8. The method of claim 1, wherein the barrier layer is formed by depositing a cobalt-containing material or a nickel-containing material on the substrate by a physical vapor deposition process.

9. The method of claim 1, wherein the barrier layer is formed by depositing a cobalt-containing material or a nickel-containing material on the substrate by a chemical vapor deposition process.

10. The method of claim 1, wherein the barrier layer comprises a metallic titanium layer and a titanium nitride layer.

11. The method of claim 10, wherein the metallic titanium layer and the titanium nitride layer are each deposited by atomic layer deposition or physical vapor deposition.

12. The method of claim 1, wherein the barrier layer comprises a metallic tantalum layer and a tantalum nitride layer.

13. The method of claim 12, wherein the metallic tantalum layer and the tantalum nitride layer are each deposited by atomic layer deposition or physical vapor deposition.

14. The method of claim 1, wherein the substrate is exposed to a plasma clean process prior to forming the barrier layer.

15. The method of claim 14, wherein the substrate is exposed to a hydrogen plasma during the plasma clean process.

16. The method of claim 15, wherein the substrate is exposed to an argon plasma during the plasma clean process.

17. The method of claim 14, wherein the silane gas comprises hydrogen gas.

18. The method of claim 17, wherein the silane gas further comprises silane.

19. The method of claim 17, wherein the silane gas further comprises a silane derivative.

20. A method for depositing materials on a substrate, comprising:
   forming a barrier layer on a substrate, wherein the barrier layer comprises a metallic titanium layer and a titanium nitride layer;
   exposing the substrate to a soak gas comprising a reducing gas during a soak process;
   depositing a tungsten nucleation layer on the barrier layer during an atomic layer deposition process; and
   depositing a tungsten bulk layer on the tungsten nucleation layer during a chemical vapor deposition process.

21. The method of claim 20, wherein the soak gas comprises hydrogen gas.

22. The method of claim 21, wherein the soak gas further comprises silane.

23. The method of claim 21, wherein the soak gas further comprises a silane derivative.

24. A method for depositing materials on a substrate, comprising:
   forming a barrier layer on a substrate, wherein the barrier layer comprises a metallic tantalum layer and a tantalum nitride layer;
   exposing the substrate to a soak gas comprising a reducing gas during a soak process;
   depositing a tungsten nucleation layer on the barrier layer during an atomic layer deposition process; and
   depositing a tungsten bulk layer on the tungsten nucleation layer during a chemical vapor deposition process.

25. The method of claim 24, wherein the soak gas comprises hydrogen gas.

26. The method of claim 25, wherein the soak gas further comprises silane.

27. The method of claim 25, wherein the soak gas further comprises a silane derivative.

28. A method for depositing materials on a substrate, comprising:
   forming a barrier layer on a substrate, wherein the barrier layer comprises a metallic cobalt layer and a cobalt silicide layer;

exposing the substrate to a soak gas comprising a reducing gas during a soak process;
depositing a tungsten nucleation layer on the barrier layer during an atomic layer deposition process; and
depositing a tungsten bulk layer on the tungsten nucleation layer during a chemical vapor deposition process.

29. The method of claim 28, wherein the soak gas comprises hydrogen gas.

30. The method of claim 29, wherein the soak gas further comprises silane.

31. The method of claim 29, wherein the soak gas further comprises a silane derivative.

32. A method for depositing materials on a substrate, comprising:
forming a barrier layer on a substrate, wherein the barrier layer comprises a metallic nickel layer and a nickel silicide layer;
exposing the substrate to a soak gas comprising a reducing gas during a soak process;
depositing a tungsten nucleation layer on the barrier layer during an atomic layer deposition process; and
depositing a tungsten bulk layer on the tungsten nucleation layer during a chemical vapor deposition process.

33. The method of claim 32, wherein the soak gas comprises hydrogen gas.

34. The method of claim 33, wherein the soak gas further comprises silane.

35. The method of claim 33, wherein the soak gas further comprises a silane derivative.

36. A method for depositing materials on a substrate, comprising:
forming a barrier layer on a substrate, wherein the substrate contains at least one feature formed within a dielectric layer and the barrier layer comprises a metallic layer and a metal nitride layer;
exposing the substrate to a silane gas to form a thin silicon-containing layer on the barrier layer during a soak process;
depositing a tungsten nucleation layer over the barrier layer and the thin silicon-containing layer during an atomic layer deposition process; and
filling the at least one feature on the substrate by depositing a tungsten bulk layer on the tungsten nucleation layer during a chemical vapor deposition process.

37. A method for depositing materials on a substrate, comprising:
forming a barrier layer on a substrate, comprising:
depositing a titanium nitride layer on the substrate by atomic layer deposition or physical vapor deposition; and
depositing a metallic titanium layer on the titanium nitride layer by atomic layer deposition or physical vapor deposition;
exposing the substrate to a silane gas to form a thin silicon-containing layer on the barrier layer during a soak process;
depositing a tungsten nucleation layer over the barrier layer and the thin silicon-containing layer during an atomic layer deposition process; and
depositing a tungsten bulk layer on the tungsten nucleation layer during a chemical vapor deposition process.

38. A method for depositing materials on a substrate, comprising:
forming a barrier layer on a substrate, comprising:
depositing a metallic tantalum layer on the substrate by atomic layer deposition or physical vapor deposition; and
depositing a tantalum nitride layer on the metallic tantalum layer by atomic layer deposition or physical vapor deposition;
exposing the substrate to a silane gas to form a thin silicon-containing layer on the barrier layer during a soak process;
depositing a tungsten nucleation layer over the barrier layer and the thin silicon-containing layer during an atomic layer deposition process; and
depositing a tungsten bulk layer on the tungsten nucleation layer during a chemical vapor deposition process.

* * * * *

UNITED STATES PATENT AND TRADEMARK OFFICE
CERTIFICATE OF CORRECTION

| | |
|---|---|
| PATENT NO. | : 7,416,979 B2 |
| APPLICATION NO. | : 11/456073 |
| DATED | : August 26, 2008 |
| INVENTOR(S) | : Yoon et al. |

Page 1 of 1

It is certified that error appears in the above-identified patent and that said Letters Patent is hereby corrected as shown below:

Title
In the References Cited (56):

Please delete "6,007,403 A 12/1999 Urspringer et al." and insert --6,077,403 A 6/2000 Kobayashi et al.-- therefor.

Signed and Sealed this

Tenth Day of February, 2009

JOHN DOLL
*Acting Director of the United States Patent and Trademark Office*